(12) United States Patent
Schroder et al.

(10) Patent No.: US 6,908,515 B2
(45) Date of Patent: Jun. 21, 2005

(54) TREATMENT OF CIRCUIT SUPPORT WITH IMPULSE EXCITATION

(75) Inventors: Rolf Schroder, Burgthann (DE); Reinhard De Boer, Berlin (DE); Hans-Joachim Grapentin, Berlin (DE); Regina Czeczka, Gross Glienicke (DE)

(73) Assignee: Atotech Deutschland GmbH, Berlin (DE)

( * ) Notice: Subject to any disclaimer, the term of this patent is extended or adjusted under 35 U.S.C. 154(b) by 287 days.

(21) Appl. No.: 10/221,235

(22) PCT Filed: Mar. 21, 2001

(86) PCT No.: PCT/DE01/01127

§ 371 (c)(1),
(2), (4) Date: Sep. 10, 2002

(87) PCT Pub. No.: WO01/72096

PCT Pub. Date: Sep. 27, 2001

(65) Prior Publication Data

US 2003/0029717 A1 Feb. 13, 2003

(30) Foreign Application Priority Data

Mar. 23, 2000 (DE) ........................................ 100 15 349

(51) Int. Cl.⁷ ................................................ B08B 3/12
(52) U.S. Cl. ............................ 134/1; 134/15; 134/64 R; 134/184
(58) Field of Search ............................ 134/1, 15, 64 R, 134/122 R, 166 R, 169 R, 184, 199, 122; 366/116, 127, 128

(56) References Cited

U.S. PATENT DOCUMENTS

| 5,077,099 A | * | 12/1991 | Kukanskis et al. | ......... 427/437 |
| 6,016,817 A | * | 1/2000 | Henig | ......... 134/1.2 |
| 6,077,359 A | * | 6/2000 | Baron et al. | ......... 134/2 |

FOREIGN PATENT DOCUMENTS

| DE | 30 11 061 A1 | 3/1980 |
| DE | 40 21 581 A1 | 7/1990 |
| DE | 90 11 675.5 UI | 8/1990 |
| DE | 40 40 119 C2 | 12/1990 |
| DE | 42 26 701 A1 | 8/1992 |
| DE | 43 22 378 A1 | 7/1993 |
| DE | 195 29 757 A1 | 8/1995 |
| EP | 0 212 253 B1 | 2/1990 |
| EP | 0 446 522 A1 | 12/1990 |
| EP | 0 586 770 A1 | 9/1992 |
| EP | 0 329 807 B1 | 3/1993 |
| EP | 0 752 807 A1 | 8/1997 |
| WO | WO 92/01088 | 1/1992 |
| WO | WO 96/21341 | 7/1996 |

OTHER PUBLICATIONS

European Patent Office Patent Abstract of Japan, vol. 14, No. 16, dated Dec. 1, 1989.
European Patent Office Patent Abstract of Japan, Pub. No. 54158337, dated Dec. 14, 1979.

* cited by examiner

*Primary Examiner*—Michael Barr
*Assistant Examiner*—Saeed Chaudhry
(74) *Attorney, Agent, or Firm*—Paul & Paul

(57) ABSTRACT

The devices and methods of the art do not readily allow moistening of, removing gas bubbles from and/or increasing the transfer of material in through bores and/or pocket holes in printed circuit boards (PCB). Considerable problems are presented by the treatment of very narrow bores with high aspect ratios in particular. To overcome this problem a method was found that involves the following stages: the printed circuit boards PCB are passed through a processing plant on a horizontal conveying path and in one conveying plane 2 by means of transportation means 13, 14 and are thereby brought to contact a liquid for treatment, wherein mechanical pulses are directly transmitted to the printed circuit boards PCB via the transportation means 13, 14 and/or via the liquid for treatment by means of pulse generating means 50.

16 Claims, 15 Drawing Sheets

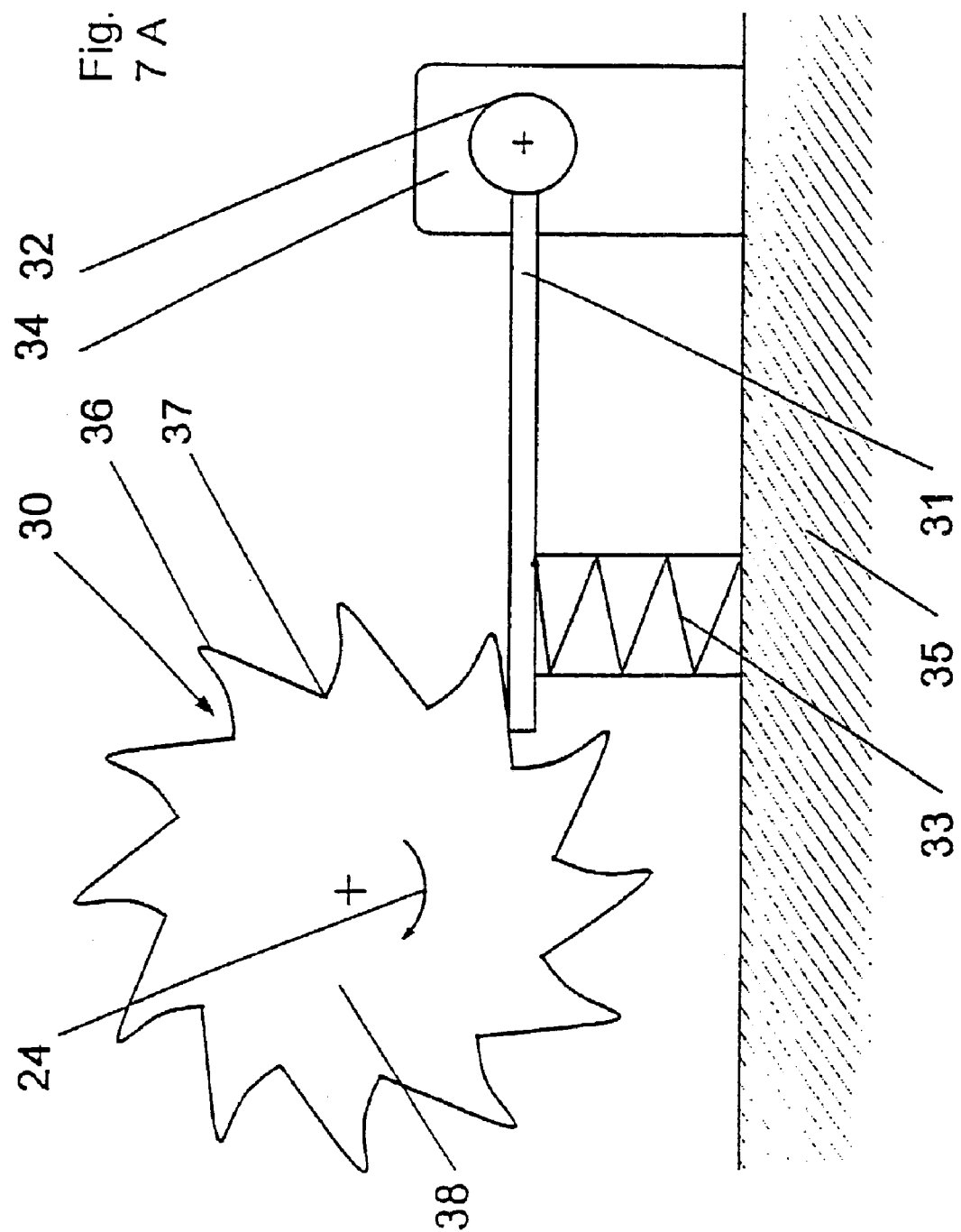

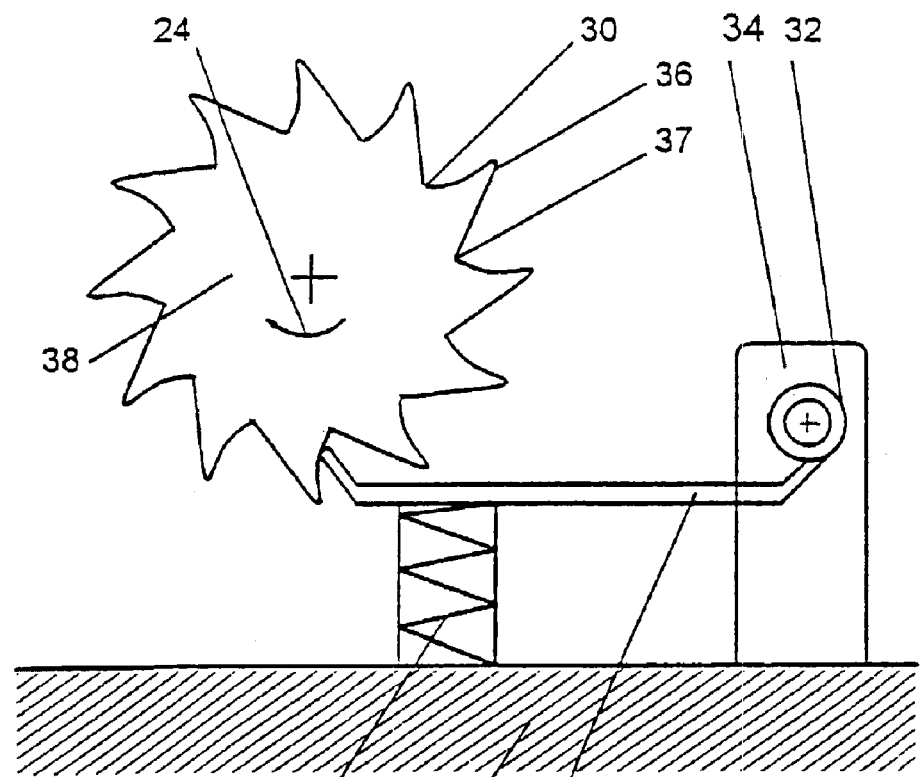
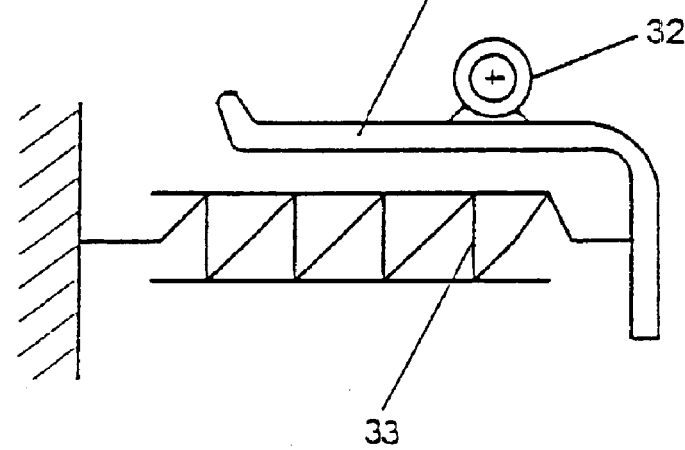

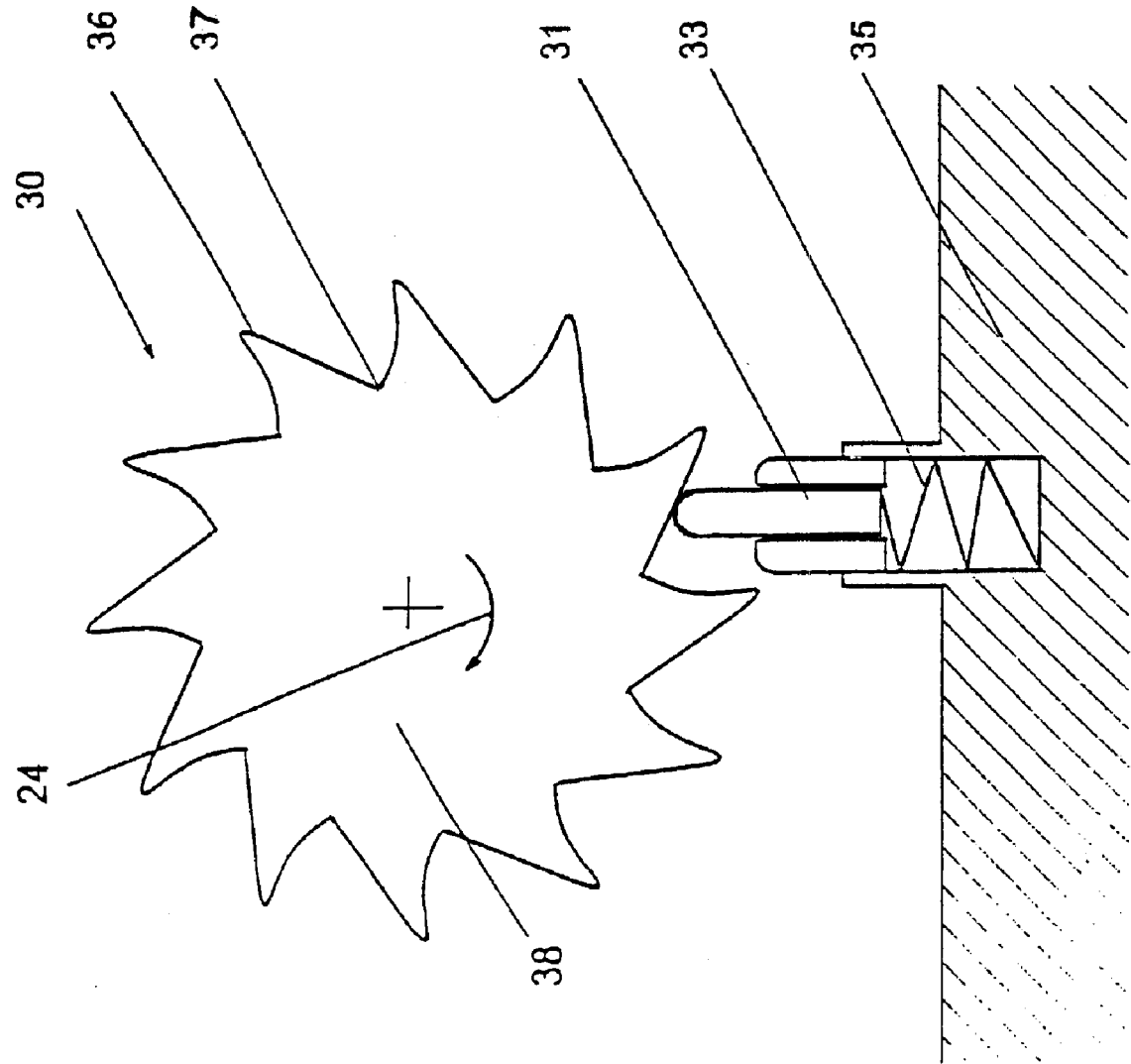

TREATMENT OF CIRCUIT SUPPORT WITH IMPULSE EXCITATION

The invention relates to a method and a device for treating circuit carriers provided with through holes and/or cavities. The method and the device may be used in particular for promoting moistening of, for removing gas bubbles from and/or for increasing the transfer of material in through bores and/or pocket holes in printed circuit boards.

For manufacturing printed circuit boards, printed circuit films and other circuit carriers such as chip carriers and multichip modules, employment is made of electroplating processes in order to create the circuit section on the outer sides of these boards, films or carriers and to provide the walls of the bores with a conductive coating for the electrical connection of several circuit planes. The principal methods used in this connection are pretreatment, aftertreatment as well as metallization. Pretreatment includes cleaning, etching and activating processes and after treatment includes etching, passivation and other methods for supplying protective coatings. The methods more specifically used in metallization are electrolytic methods, reductive (electroless) chemical methods and cementation.

As the packing density in the circuit carriers increases, the bores are required to have an ever smaller diameter. The liquid for treatment is no longer capable of penetrating readily such narrow bores. The final removal of liquid in the drying process is no longer readily possible either. The transfer of material between the treating bath and the interior of the bores becomes very poor particularly when the diameter of the bores is small while the carriers are very thick. The ratio of the carrier thickness to the diameter of the bore (aspect ratio) determines the transfer of material. If the bores that traverse the carrier have an aspect ratio of 6:1 and more, problems may occur in electrolytic treatment when no additional provisions are made for reinforcing the transfer of material. So-called pocket holes in particular, which only project into the carrier material from one side, are difficult to be treated with the liquids for treatment. With these bores, which are in parts very small (diameter of 100 $\mu$m for example), an aspect ratio of 1:1 may already cause considerable problems.

To eliminate these difficulties, numerous suggestions have already been made. It has been proposed for example to have the circuit boards that are dipped into a solution for treatment moved slowly back and forth at right angles with the surface of the board in order to achieve a through flow at least in the through holes. Air is in parts additionally entered into the treating baths in order to thus generate a strong convection in the baths. These measures however very soon proved insufficient to have the very small bores, which have a diameter of 0.5 mm and less, efficiently circulated.

To mitigate the problems, there has been described in DE 30 11 061 A1 a method for intensifying swilling and cleaning processes for bores in printed circuit boards. To this effect the printed circuit boards are conveyed on a horizontal conveying path and in a horizontal operational position through a processing plant and are guided in the process through a line where they are splashed at with a flushing agent, said liquid flushing agent being delivered from said line to the underside of the printed circuit boards via open seam tubes. In so doing, the flushing agent also reaches the downward opening bores. Lacquers and liquid etching agents may thus efficiently be scoured from the holes and other openings.

A similar arrangement for cleaning, activating and/or metallizing boreholes in horizontally guided printed circuit boards has been indicated in EP 0 212 253. In this case too, the printed circuit boards which are guided in horizontal operational position are led past a facility that is provided with a nozzle arranged underneath the conveying band at right angles with the direction of transportation. The nozzle used is a splash nozzle that delivers the liquid treating agent normal to the sides of the boards.

According to EP 0 329 807 B1, further improvement is effected by providing, in addition to a splash nozzle, a suction equipment on that side of the board that is averse to the splash nozzle, said suction equipment being arranged on a surface of the board which is guided in horizontal direction and in a horizontal operational position. It is also considered to be of advantage that scoured impurities are said to be prevented from depositing on the surfaces of the boards.

DE 40 40 119 C2 describes a method of leading a flow through bores in printed circuit boards which are conveyed in a horizontal operational position and on a horizontal conveying path. Rollers arranged opposite each other and abutting on either side of the printed circuit boards are provided for delivering liquid for treatment. In operation, the liquid for treatment is conducted via the hollow space to the one roller (nozzle cylinder), passes through the discharge openings thereof, which are open in contact between the nozzle cylinder and the board, is directed through the bores in the boards and enters the counter pressure roller, which is hollow as well, through intake openings. Valves which are solidly connected to a fluid permeable casing are provided in the discharge openings of the nozzle cylinder. If the valves are lifted out of the valve seat, the liquid is channelled through the cleared annular passage and is advanced to the bores.

EP 0 752 807 A1 describes another device for treating printed circuit boards. The printed circuit boards are conveyed in a horizontal operational position and in a horizontal conveying direction past facilities consisting each of a slotted tube and of a feed cylinder arranged within said tube. The slot of the tube is open to the conveying plane. Part of the feed cylinder protrudes from the slot to carry the boards along. Narrow gaps are formed between the boundaries of the slot and the cylinder through which liquid for treatment, which has been forced under pressure through the tube, may be discharged and advanced to the boards and through the bores in the boards.

Another possibility to intensify the transfer of material in the bores consists in achieving improved circulation of fluid in the bores by means of vibration equipments.

To this effect, a rack for holding parts with holes that are difficult to electroplate has been described in EP 0 586 770 A1, at least one vibrator being arranged on a mounting rail serving to hold the work and spaced from the places where the mounting rail is resting on a rim of a receptacle. In this event, the circulation of fluid in the holes is generated by the oscillations that are transmitted by the vibrator onto the rack and onto the parts attached to it.

EP 0 446 522 A1 describes a similar facility that is intended to serve for the electroless copper plating of printed circuit boards. This facility is provided with a receptacle for receiving the electroless precipitating bath, with a rack for holding the printed circuit boards immersed into the precipitating bath and with a vibrator for generating oscillations from vibration in the printed circuit boards. The vibrator is attached to the supporting rod holding a cage containing the piled printed circuit boards.

device for removing impurities (bore dust) from bores of printed circuit boards has been disclosed in Patent Abstracts of Japan from JP-A-1258488, the printed circuit boards being passed in horizontal direction and in horizontal operational position through a liquid for treatment, oscillations from vibration in the ultrasonic range being transmitted to the liquid for treatment in the neighbourhood of the level of transportation of the printed circuit boards so that the printed circuit boards are exposed to these oscillations as they are guided past the ultrasonic generators.

An arrangement for generating oscillations from vibration in printed circuit boards guided in horizontal direction and in horizontal operational position has been described in WO 96/21341 A1 and in DE 43 22 378 A1. In this event, the printed circuit boards are brought to move in a combined motion consisting of oscillations from vibration, generated in the printed circuit boards preferably at a frequency superior to approximately 1 Hz by means of a counterbalancing vibrator, and of a gliding forward movement. The oscillation movements from vibration are preferably circular or near-circular, whereby the plane of the circle can be arranged in the plane of the boards or normal to it. The movements may also be linear. They preferably follow a sinusoidal curve. To bring the printed circuit boards to describe such a combined movement, thereby transmitting galvanizing current, is extremely complicated.

WO 92/01088 A1 discloses a method and a device for moving printed circuit boards provided with bores during electroplating. In this case, the printed circuit boards are attached to supporting racks and are immersed into an electroplating liquid in a vertical position. The method therein described is preferably used for printed circuit boards with bores that have an aspect ratio of at least 8:1. For the purpose of removing residual matter in the bores, the boards are vibrated at a frequency of at least 4 to 5 Hz, the oscillations generated in the boards running at least partially in direction of the longitudinal axis of the bores and the oscillations from vibration being performed only or at least mainly on the supporting rack of the printed circuit boards. The oscillation generators are accommodated on a conveying and/or on a supporting part for the printed circuit boards. In the document, attention is drawn to the fact that this method and this device also permit to remove from the bores gas bubbles that occur during chemical or electrochemical processes. It also suggests to knock or hit the printed circuit boards during vibration, thus assisting the gas bubbles in detaching.

DE 90 11 675 U1 describes a device for the surface treatment and the electroplating of printed circuit boards. For electroplating, the printed circuit boards are immersed into the liquids for treatment in vertical position. For this purpose, the boards are attached to a supporting rack that is slowly moved back and forth in the liquid for treatment together with the printed circuit boards. The document points out that, at a first contact with the liquids for treatment, gas bubbles remain in the bores, these bubbles being particularly difficult to remove from bores having a high aspect ratio. It says that a well-known method for vibrating the boards by striking them by hand with a hammer or a beater is expensive and hardly influences the continuous improvement of the transfer of material in the barrier layer on the wall of the bore. Moreover, according to this document, success is uncertain with multilayer circuits having up to 30,000 bores with a diameter of 0.3 mm and in which small bubbles may be found. In responding to these problems, the document suggests superimposing a comparatively fast relative movement between the liquid for treatment and the workpiece immersed into it upon the slow motion of the supporting rack with the printed circuit boards attached to it. The frequency of the fast relative movement is said to lie in the infrasound or in the sound range. To generate the oscillating movement, employment is made of a mechanical oscillator or vibrator serving as a mechanical vibrating facility.

The methods and devices of the art are too complicated or not suited for reliably driving out gas bubbles from very small bores, from pocket holes in particular, even when passage through the plant is horizontal. Furthermore, as yet, no satisfactory solution has been suggested by the methods and devices of the art to carry out the transfer of material in pocket holes.

Therefore, the basic problem of the present invention is to overcome the drawbacks of the methods and devices of the art and more specifically to find a device and a method that guarantee the removal of gas bubbles from through bores in circuit carriers with a very high aspect ratio, of 15:1 and more for example, and from pocket holes having very small diameters, such as for example less than 0.2, and relatively high aspect ratios, of at least 0.8:1 for example. Additionally, the method should be easy to accomplish and the realization of the device should be made possible without considerable instrumental expenditure.

The solution of this problem is to provide the device according to claim 1, the method according to claim 12, the use of the device according to claim 23 and the application of the method according to claim 24. Preferred embodiments of the invention are recited in the subclaims.

The device according to the invention serves to process circuit carriers provided with through holes and/or cavities. The device is suited in particular for promoting moistening of, for removing gas bubbles from and/or for increasing the transfer of material in through bores and/or pocket holes in printed circuit boards, through bores having an aspect ratio of 15:1 and more and pocket holes having an aspect ratio of 0,8:1 and more being particularly suited for secure treatment. The device and the method of the invention may particularly be utilized in the electroplating process steps for manufacturing printed circuit boards, such as for example in cleaning, pretreatment and metallization as well as in further kinds of methods. The invention may be advantageously used in removing gas bubbles when the bores in circuit carriers are moistened for the first time, in removing impurities from the bores during cleaning and in the transfer of material in the bores to take fresh liquid for treatment to the surfaces to be treated (during metallization for example).

The device according to the invention is provided with facilities serving to contact the liquid for treatment with the circuit carriers, e.g., nozzles such as splash nozzles, injection nozzles and spray nozzles. The device may also be designed is such a way that the circuit carriers to be treated are passed through a dammed-up bath of the liquid for treatment. In this case, the facilities for contacting the liquid for treatment with the circuit carriers include the pipes for feeding the liquid into the space in which the circuit carriers are guided as well as damming means such as press rolls and/or walls of receptacles.

Furthermore, the device according to the invention is provided with means of transportation and possibly with separate holding means for the circuit carriers, by means of which the circuit carriers may be conveyed on a horizontal conveying path and in one conveying plane. The means of transportation may also be designed as holding and guiding means and may as well serve to supply the current. Clamps or grippers seizing the sides, rotating means such as rolls, wheels and cylinders as well as dragging or pushing devices, in the form of clamps for example, may be utilized as holding, conveying and guiding means.

Pulse generating means are furthermore provided by means of which the circuit carriers may be excited mechanically in a pulsed manner either directly, by way of the means of transportation and/or by way of the liquid for treatment. As opposed to sinusoidal oscillations for example, the oscillation forms of pulse excitation cause abrupt changes of motion in the circuit carriers. The excitations meant are striking, hitting or beating excitations. Repeated excitations are also meant to be pulse excitations such as oscillations having substantially a rectangular or a serrated shape for example, i.e., such oscillations that have a high proportion of higher-frequency harmonic oscillations if they cause abrupt changes in motion to occur in the circuit carriers in the way mentioned above. The repeating rate of the pulse excitations may lie in the infrasound or in the sound range. The width chosen for the pulses should be such that gas bubbles can be removed in the most efficient way possible and that the most efficient transfer of material is made possible in the way according to the invention. Typically, strokes or rectangular pulses respectively are applied with a pulse width of at least 50 msec.

Accordingly, by pulse generating means we do not mean such means, like e.g. vibrators, that merely generate oscillations in the circuit carriers. Ultrasound sources that are in contact with the liquid for treatment are not considered a pulse generating means in accordance with the invention either since these means also generate sinusoidal oscillations and since the high-frequency oscillations generated by these sources are not capable of exciting the circuit carriers because of their mass, which is too large for this purpose.

As a matter of fact, only the excitation by means of impacts, shocks or beats proved suited to achieve the inventive effects.

The circuit carriers are conveyed with the help of transportation means on the horizontal conveying path and in one conveying plane and are thereby brought in contact with the liquid for treatment for specifically promoting moistening of, for removing gas bubbles from and/or for increasing the transfer of material in through bores and/or pocket holes in printed circuit boards.

The pulse generating means directly transmit mechanical pulses onto the circuit carriers by way of the transportation means and/or by way of the liquid for treatment. With relatively simple means the devices according to the invention may be readily retrofitted in already existing processing plants at low cost. It is often sufficient to have the device according to the invention accommodated at the entrance of the circuit carriers in the processing area in order to guarantee moistening of the surfaces of the circuit carriers with the liquid for treatment.

More specifically, the pulse generating means may be arranged and designed in such a way that pulses may be generated whose components act vertically upon the surface of the circuit carriers. In this case, pulses are generated that act substantially vertically upon the surface of the circuit carriers. If necessary, the pulses may also be provided with horizontal pulse components. Pulses with pulse components that act vertically upon the surface of the circuit carrier are particularly advantageous since in this case the excitation of the circuit carriers is more effective than in such a case in which pulses are used that act substantially parallel to the surface of the circuit carriers as a great enough traction of the pulse generating means with the surface of the circuit carriers has to be provided in order for the pulses to efficiently enter the circuit carriers. Additionally, the axes of the bores are generally also normal to the surface of the circuit carriers so that a pulse acting substantially at right angles to the surface may contribute more efficiently to the transfer of material or to the removal of gas bubbles than a pulse acting substantially parallel to the surface. Pulses acting substantially vertically may be readily entered by means of pulse generating means resting on the surfaces. Vertically acting pulses may be applied onto the circuit carriers from beneath as well as from above.

The small through bores and pocket holes may be treated in a particularly efficient manner when the circuit carriers are conveyed on a substantially horizontal conveying path. In so doing, the circuit carriers can be led past the nozzles at no great distance from them so that the liquid for treatment can be delivered to the surfaces of the circuit carriers and into the bores with a strong flow. More specifically, constant flow conditions are achieved for all the surface areas thanks to the fact that the distance between the nozzle apertures and the surfaces may be kept constant. In practical testing, the device and the method according to the invention proved to be suitable for processing printed circuit films of a very reduced thickness whereas methods of the art fail in this case.

Rotating transportation means are preferably used. In this event, the pulse generating means may be arranged and designed in such a way that the pulses may be generated and/or controlled by a rotation of the transportation means. Preferred embodiments in which the pulses are generated and/or controlled by rotation will be represented hereinafter by way of example.

In a first preferred embodiment of the present invention, the transportation means employed are at least in parts feed rollers. These feed rollers, or at least some of them, are each provided with a substantially cylindrical hollow space. On the substantially cylindrical inner wall of the hollow space, at least one projection extends in axial direction, said projection may be interrupted if so desired. The hollow space moreover includes at least one body serving as a pulse generating means that rolls along the inner wall of the feed rollers, is carried along by the projection, jumps over said projection as it continues to rotate, falling down the projection in the process and onto the inner wall of the feed roller. In so doing, pulses are transmitted to the feed rollers and from the feed rollers to the circuit carriers. The hollow space can be provided with several projections extending in axial direction each, these projections being regularly or irregularly spaced apart from each other along the periphery of the inner wall. Such transportation means will be designated hereinafter as beating rollers.

Projections extending in axial direction may be continuous stumble strips but also discontinuous strips as well as projections consisting of singular nub-like protuberances and being arranged on an axially running line. The height of the projections protruding into the hollow space must be such that the body, which is not attached in the hollow space, is at least partially taken along by the revolution of the feed roller when the feed roller is rotating, the rotation taking place through about 90° for example. The size of the body hereby is directly related to the height of the projections: if a smaller body is used, the projection may be smaller as well, and vice versa. The size of the body and the size of the at least one mating projection must be so large that the body, when leaping over the projection and subsequently falling onto the lower area of the inner wall of the roller, generates a noticeable pulse onto the rollers, said pulse being transmitted to the circuit carriers.

The body is preferably substantially cylindrical in shape and has the highest possible weight in order to generate a strongest possible pulse when falling onto the inner wall of the rollers, the fall path too having to be taken into consideration: if the fall path is long and/or the weight high, the pulse that is generated is greater than if the fall path is shorter and/or the weight lower. The body may be a steel rod for example, said rod being substantially just as long as the hollow space. As a result thereof, a large axial play of the body in the hollow space is avoided. The pulse generated is the stronger the larger the diameter of the feed rollers since in this event the fall path of the body is longer.

In an alternative embodiment the hollow space of the feed roller is not cylindrical. The hollow space is rather provided with substantially axially running inner edges. In this case, the section of the hollow space is preferably square. A body serving as a pulse generating means and located in the hollow space rolls along the side faces of the hollow space when the feed roller is made to rotate. Since the body hereby falls from one inner edge of the hollow space into the other, pulses are transmitted by the body to the roller and from the roller to the circuit carriers.

The circuit carriers are preferably conducted through the processing plant in a horizontal conveying plane. The beating rollers may be arranged above or beneath or on both sides of the conveying plane, e.g., alternately above and beneath the conveying plane. The pulses generated by the beating roller are repeatedly transmitted to the circuit carriers, the pulse frequency depending on the rotating velocity of the roller and, as a result thereof, on its diameter and on the rate of feed of the circuit carriers.

Alternatively, pulses may also be transmitted to the circuit carriers by a hammer-like device. A hammer may for example be arranged on the upper side or on the underside of the conveying plane in such a manner that it beats the surface of the circuit carriers as they pass by. The hammer may be driven or controlled respectively by the rotation of the transportation means.

In another embodiment according to the invention the transportation means are at least partially connected to at least one wheel each, each wheel being provided on its periphery with at least one projection, they are rotatably carried together with the at least one wheel with one common axis and the beater, which is springy or spring mounted and serves as a pulse generating means, is resting on the periphery of the at least one wheel in such a manner that mechanical pulses are transmitted to the at least one wheel and, as a result thereof, to the transportation means preferably rigidly connected to the at least one wheel and from said transportation means to the circuit carriers by the beater when gliding over the projection.

One or several wheels may for example be attached together with a feed roller or with rolls or wheels to a common axis so that the wheel or the wheels are caused to rotate in synchronism with the rotation of the feed roller, the rolls or the wheels.

The wheel may be provided on its periphery with one or several projections that are held apart from each other for example. In case several projections are provided for, said projections may be positioned at regular or irregular intervals around the periphery of the wheel. In a particularly preferred embodiment the wheels are designed like ratchets, i.e., the wheel has a serrated circumference.

The beater that rests on the periphery of the wheel or wheels may be designed as a lever which is biassed by a spring and is pressed against the periphery. In another embodiment the beater may also be designed as a pin that is resiliently pressed against the periphery in a substantially tangential or even radial direction by means of a mechanical spring or of pneumatic means for example.

The rotation of the feed rollers, the wheels or the rolls causes the wheels provided with the projections to rotate as well so that the beater glides over at least one projection, is strongly accelerated and is struck against the periphery of the wheel by the force of the spring so that mechanical pulses are transmitted to the wheel and the feed roller, the wheels or the rolls connected to the wheel and from there in turn to the circuit carriers. The force of the spring and the mass of the beater must be such that the mechanical pulses generated by the beater striking the periphery of the wheel be strong enough.

The pulse generating means of this embodiment may be used with a horizontally and with a vertically oriented conveying plane alike and may be arranged above as well as beneath the conveying plane when the circuit carriers are guided in a horizontal conveying plane. The pulses exerted onto the circuit carriers are more specifically repeat pulses. The pulse frequency is conditional on the rotating velocity of the transportation means and thus depends on the diameter of the transportation means and on the rate of feed of the circuit carriers as well.

In another embodiment according to the invention the transportation means are at least partially equipped with one magnetic core each. The transportation means of interest are preferably feed rollers. At least one electromagnet serving as a pulse generating means is assigned to each transportation means fitted with the magnetic core in such a manner that, by having current supplied into the electromagnet in a pulsed way, a force may be exerted onto the transportation means fitted with the magnetic core in such a way that mechanical impulses resembling strokes are generated in the circuit carriers by way of the transportation means.

The magnetic core may be made of a ferromagnetic material such as steel for example so that, when current is supplied to the electromagnet, an attractive force acts between the electromagnet and the ferromagnetic core and that the transportation means is lifted from the circuit carriers.

The transportation means may also be equipped with a magnetized material (permanent magnet). The permanent magnet is rotated by the rotation of the transportation means. If the permanent magnet is arranged in the transportation means in such a manner that the poles of the magnet are oriented in radial direction, it is at times the one pole and at times the other pole of the magnet that points toward the electromagnet. If the direction of the magnetic field of the electromagnet is not modified in time, the effect exerted upon the transportation means may be repulsive or attractive depending on the rotational position of the permanent magnet. By synchronization of a train of pulses of the magnetic field of the electromagnet, the transportation means may be either attracted in a pulsed manner by the electromagnet or repulsed by it. An alternately attractive and repulsive effect may also be achieved by supplying the electromagnet with pulsed current in an adequate manner. This embodiment is very advantageous since mechanical pulses are thus exerted onto the circuit carriers in alternating directions so that gas bubbles located in the small bores may more readily be detached. Since on the other hand, pulsating current is always supplied to the electromagnet when a repulsive effect is exerted onto the transportation means for example, mechanical shock pulses exclusively may be transmitted to the transportation means and thus to the circuit carriers.

An additional force that is oriented toward the circuit carriers, the force of gravity and/or the force of a spring and/or a magnetic force for example, may also preferably act on the transportation means. In this event it is possible, in using a ferromagnetic core or by synchronizing the current pulses with the rotation of the transportation means when a permanent magnet is employed, to exert onto the transportation means a force that acts against this additional force so that the transportation means are lifted from the circuit carriers. When the electromagnet is switched off, the transportation means is moved back again by this additional force to the circuit carriers so that, when the transportation means strike the surfaces of the circuit carrier, mechanical pulses are thus transmitted to the circuit carriers. This is of course only possible with the proviso that the additional force is smaller than the force exerted by the electromagnet. If the additional force used is merely the force of gravitation, the transportation means, a feed roller for example, may be positioned above a horizontally oriented transportation plane. In case repeat pulses are intended to be exerted onto the circuit carriers, the pulse frequency is conditional on the time needed by the transportation means to fall back onto the circuit carriers after having been lifted from the electromagnet.

If a permanent magnet is employed in the transportation means the pulse generating means in this further embodiment may be used in a horizontally and in a vertically oriented conveying plane alike and, in case the circuit carriers are guided in a horizontal conveying plane, they may be positioned above as well as underneath the conveying plane. The pulses may be used repeatedly, the pulse frequency depending on the embodiment: if the selected variant is such that the repetition rate is controlled by the rotation of the transportation means, the pulse frequency depends on the diameter and on the rate of feed of the circuit carriers and, as a result thereof, on the rotary frequency of the transportation means. Otherwise, a discretional pulse frequency may be used, an upper limit being given by the inertia of masses of the overall system, though.

In still another embodiment according to the invention, pulse generating means are positioned within the liquid for treatment on the conveying plane by means of which pulses are transmitted via the liquid for treatment to the circuit carriers conveyed in the plane of transportation. In the pulse generating means, the pulses are preferably generated in an electromechanical way and/or are driven by compressed air and are transmitted to the liquid for treatment and from the liquid for treatment to the circuit carriers via at least one transmission means, a membrane or an oscillator for example. Pulse generating means producing infrasound or sound waves are utilized for the purpose for example, the shape of the pulse being as indicated herein above. The transmission means by means of which the pulsed waves are transmitted to the liquid for treatment is positioned as near as possible to the conveying plane for the circuit carriers in order to effect a particularly efficient transmission of the mechanical pulses to the circuit carriers. The pulse generating means are preferably arranged in such a way that the transmission means are oriented parallel to the conveying plane.

The pulse generating means of this embodiment also permit to generate trains of pulses. The pulse frequency may be adjusted freely in conformity with the inertia of masses of the system. A frequency is preferably adjusted in the infrasound range. As explained herein above, sources of ultrasound are not suited for the pulsed excitation of the circuit carriers.

Still another possibility consists in generating pulses in nozzles that abruptly deliver the liquid for treatment toward the surfaces of the circuit carriers. In this case, the liquid is delivered to the circuit carriers in pulses, thus exerting pulses onto their surfaces.

A so-called fan nozzle out of which the liquid is delivered through extremely fine nozzle apertures against the surfaces of the circuit carriers is connected to an intermittent beater operated with compressed air so that the pulses are entered into the nozzle body. Other methods for generating pulses may also be used. The complete flow of liquid or part of it may for example be constantly interrupted in an abrupt manner so that a high pressure builds up in the fluid during the interruption in the area in which the liquid is fed, said pressure dropping abruptly as the supply of liquid is being resumed, so that the liquid exits the nozzles by jerks. The pulses in the nozzle body are transmitted to the liquid for treatment exiting the nozzle so that a pulsating jet of liquid is produced which is delivered to the surfaces. The transmission of pulses onto the nozzle body additionally thwart the obstruction of the extremely fine nozzle apertures.

The present invention resides in any one of the embodiments indicated and described herein above. However, it is also possible to use combinations of the various embodiments for the purpose of operating side by side several pulse generating means in one processing plant on the one side and of realizing combinatory solutions for the generation of pulses on the other side. Pulses may for example also be transferred indirectly through the liquid for treatment onto the work by means of ratchet-like pulse generating means. Another possibility is to additionally amplify pulses generated by electromagnets in having the rollers on which the electromagnetic force acts configured as beating rollers accommodating in their hollow space metal rods adapted to generate pulses.

Reference is now made to the following drawings in order to explain more explicitly the device and the method of the invention.

FIG. 1 schematically illustrates a continuous processing plant;

FIG. 7A shows a view of a pulse generating means designed as a ratchet seen from the front;

FIG. 7B shows a view of a pulse generating means designed as a ratchet seen from the front;

FIG. 7C shows a detail of the pulse generating means designed as a ratchet;

FIG. 7D shows a view of a pulse generating means designed as a ratchet seen from the front;

Figure 12:
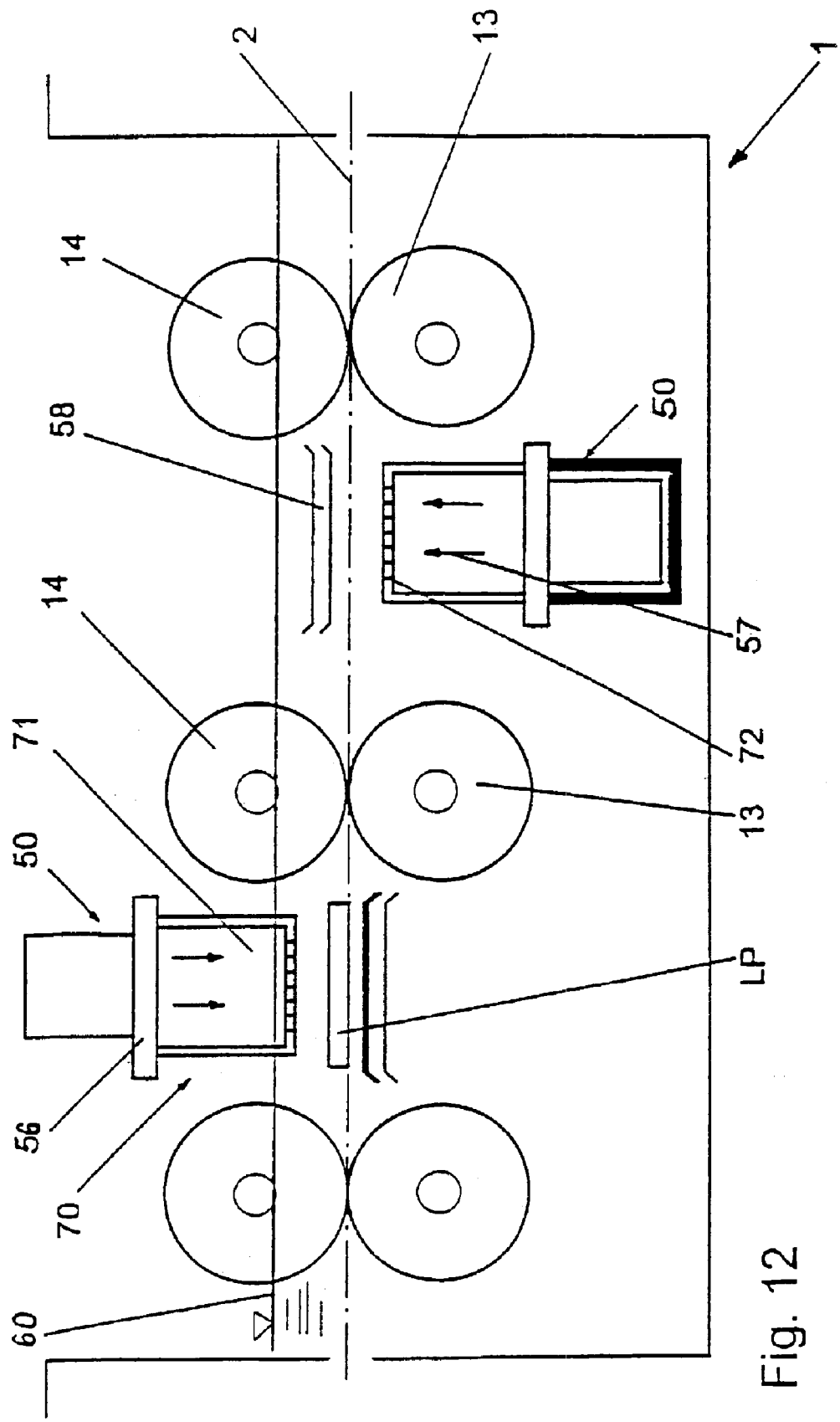
FIG. 12 shows a side view of fan nozzles that are fitted with pneumatic intermittent beaters.
Figure 13:
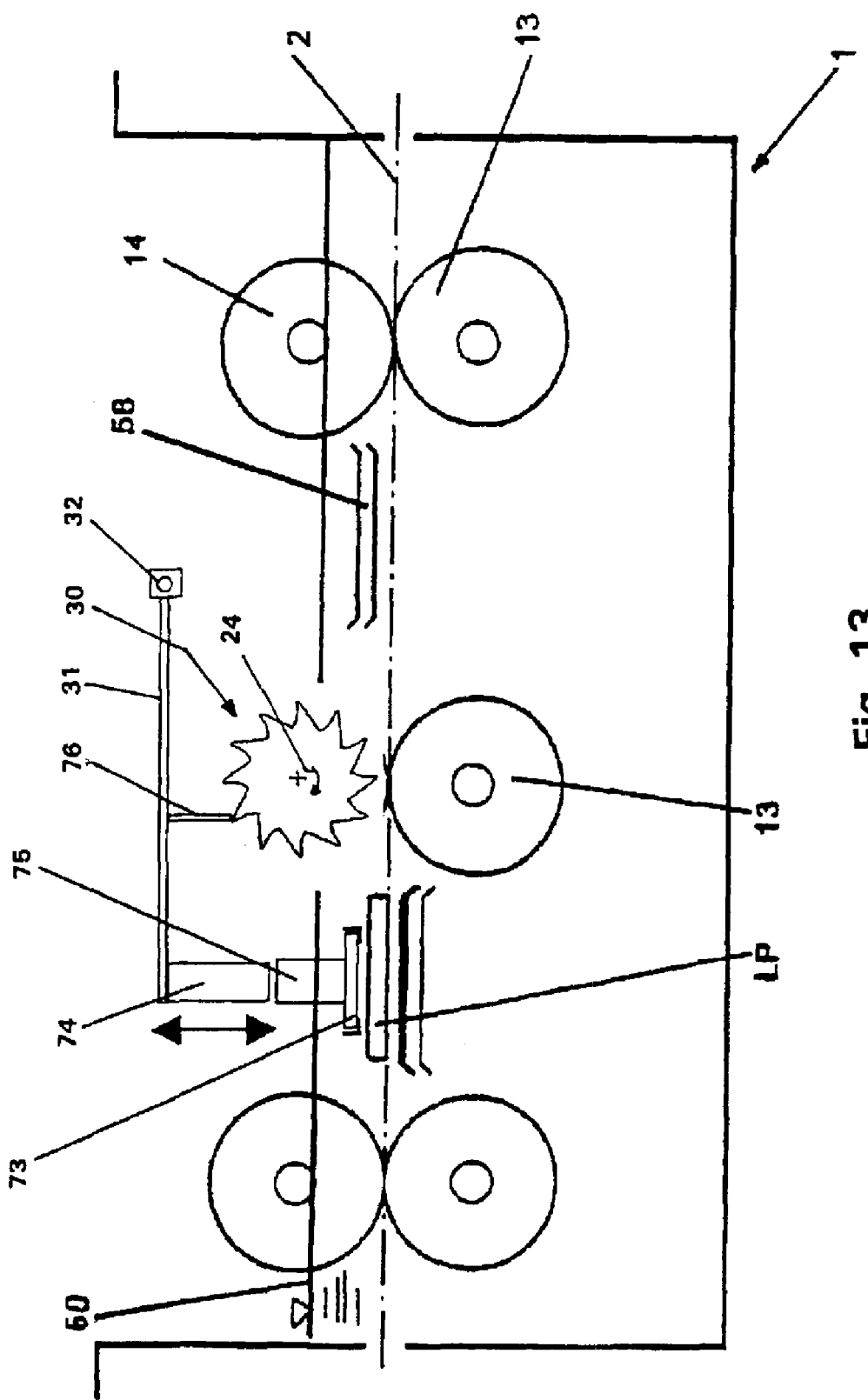

FIG. 13 like FIG. 12 but with a pulse generating means configured as a ratchet.

Figure 1:
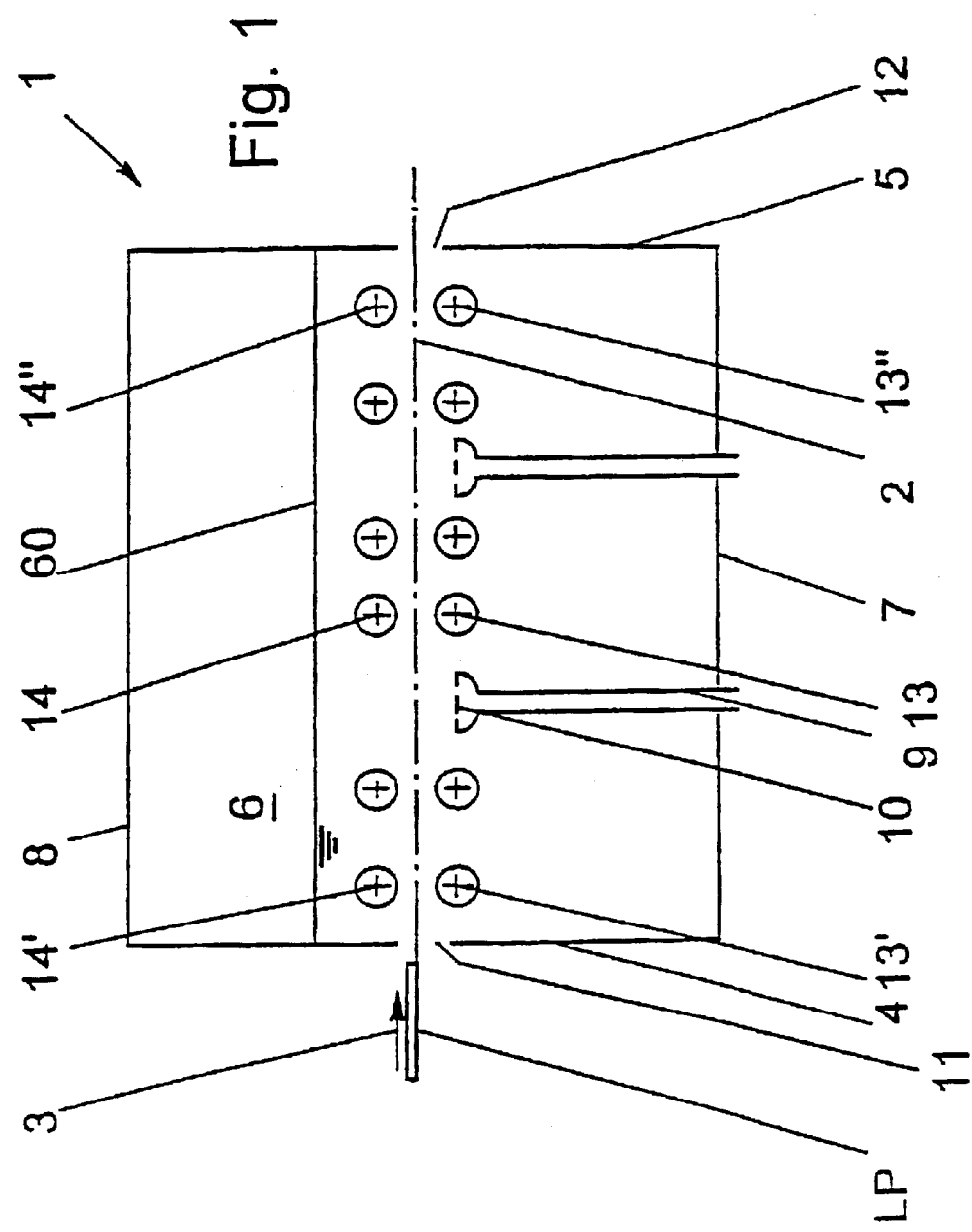

FIG. 1 shows a side view of a processing plant with a processing chamber 1 in which printed circuit boards PCB are conducted in a horizontal conveying plane 2 in the direction of transportation 3. The chamber 1 is formed by an entrance wall 4 and by an exit wall 5, by side walls 6, a chamber floor 7 and a chamber lid 8. Liquid for treatment is contained in a reservoir (not here presented), preferably underneath the processing chamber 1. The liquid for treatment is delivered to the nozzles 10 by way of pipelines 9. The nozzles 10 are designed as splash nozzles. For this purpose they are for example provided with a jet chamber having a slot oriented toward the conveying plane 2. The liquid for treatment exiting the nozzles 10 is delivered into the bores in the printed circuit boards PCB and is passed through said bores if necessary. The liquid is again drained through openings that have not been illustrated herein toward the liquid reservoir after it was brought to contact the printed circuit boards PCB.

The printed circuit boards PCB are conveyed in the direction of transportation 3 into the chamber 1 through the entrance slot 11 in the entrance wall 4. They are passed through the chamber 1 and are advanced out of the chamber 1 through the exit slot 12 in the exit wall 5.

Inside the chamber 1 there are provided feed rollers 13 and 14, the feed rollers 13 being positioned underneath and the feed rollers 14 above the conveying plane 2. The feed rollers 13, 14 serve to guide and convey the printed circuit boards PCB in the chamber 1. On their outer side, they are made at least in parts of an elastic material in order to prevent the surfaces of the printed circuit boards PCB from being damaged and to achieve the greatest possible traction between the rollers 13, 14 and the printed circuit boards PCB.

Figure 8:
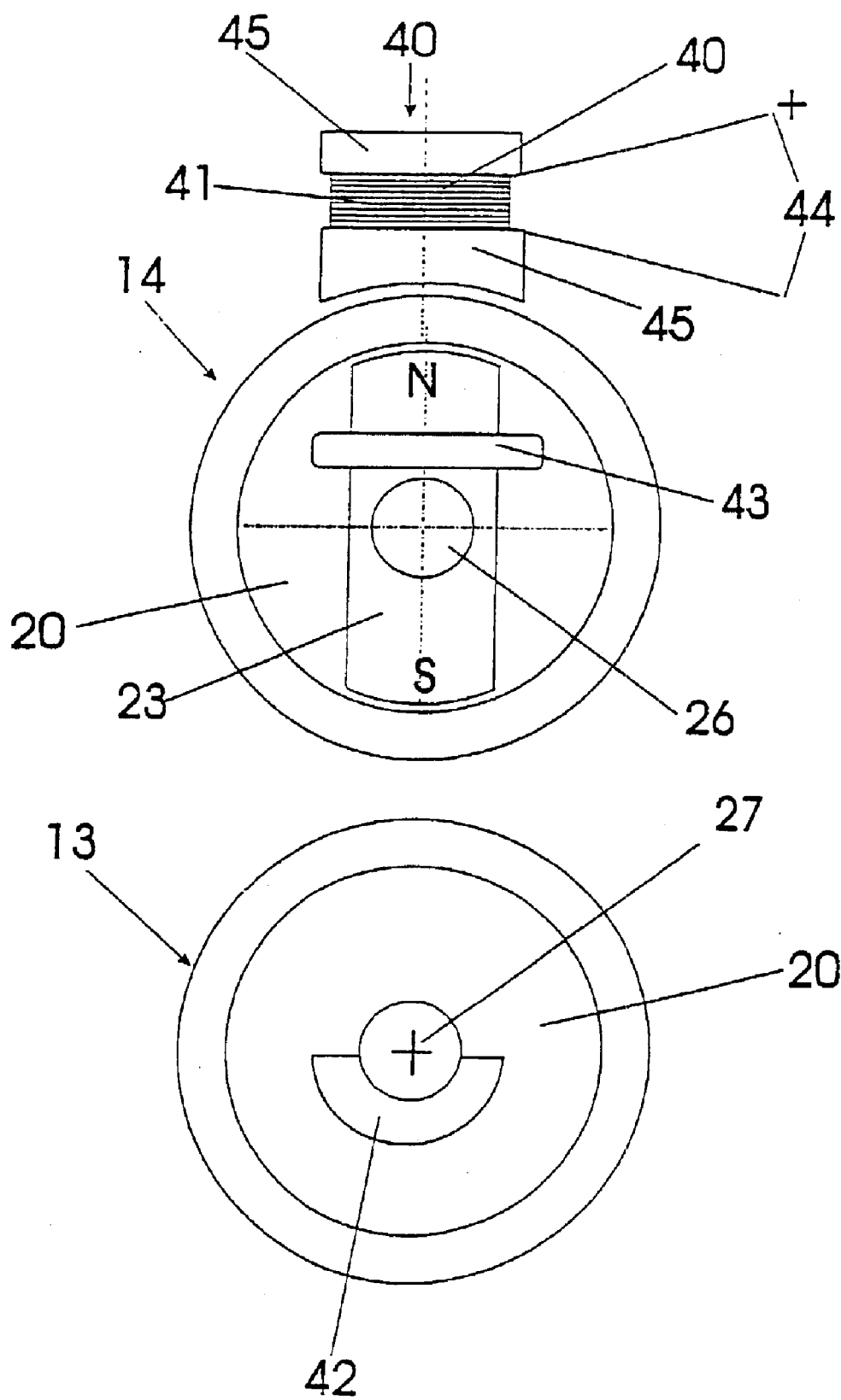
FIG. 8 shows a side view of a pulse generating means with an electromagnet.

The feed rollers 13 and 14 arranged above and underneath the plane of transportation 2 may be provided with pulse generating means 21, 31 according to the invention (FIGS. 2 through 7). Furthermore, pulse generating means 40 may be provided (FIG. 8). In a particular embodiment pulse generating means 50 may also be arranged above and/or underneath the plane of transportation 2 between the feed rollers 14 (FIG. 9 through 12). If necessary liquid for treatment must therefore also be provided above the conveying plane 2 in order to allow the mechanical pulses generated in the pulse generating means 50 to be entered into the printed circuit boards PCB via the liquid. For this purpose, the discharge of the liquid for treatment out of the chamber 1 and into the liquid reservoir is regulated in such a manner that the chamber 1 is filled up to a level 60 above the conveying plane 2. The rollers 13' and 14' arranged at the entrance slot 11 and the rollers 13" and 14" positioned at the exit slot 12 also serve as squeeze rolls whose function it is to retain the liquid for treatment and to prevent or at least hinder its exit from chamber 1.

Figure 2:
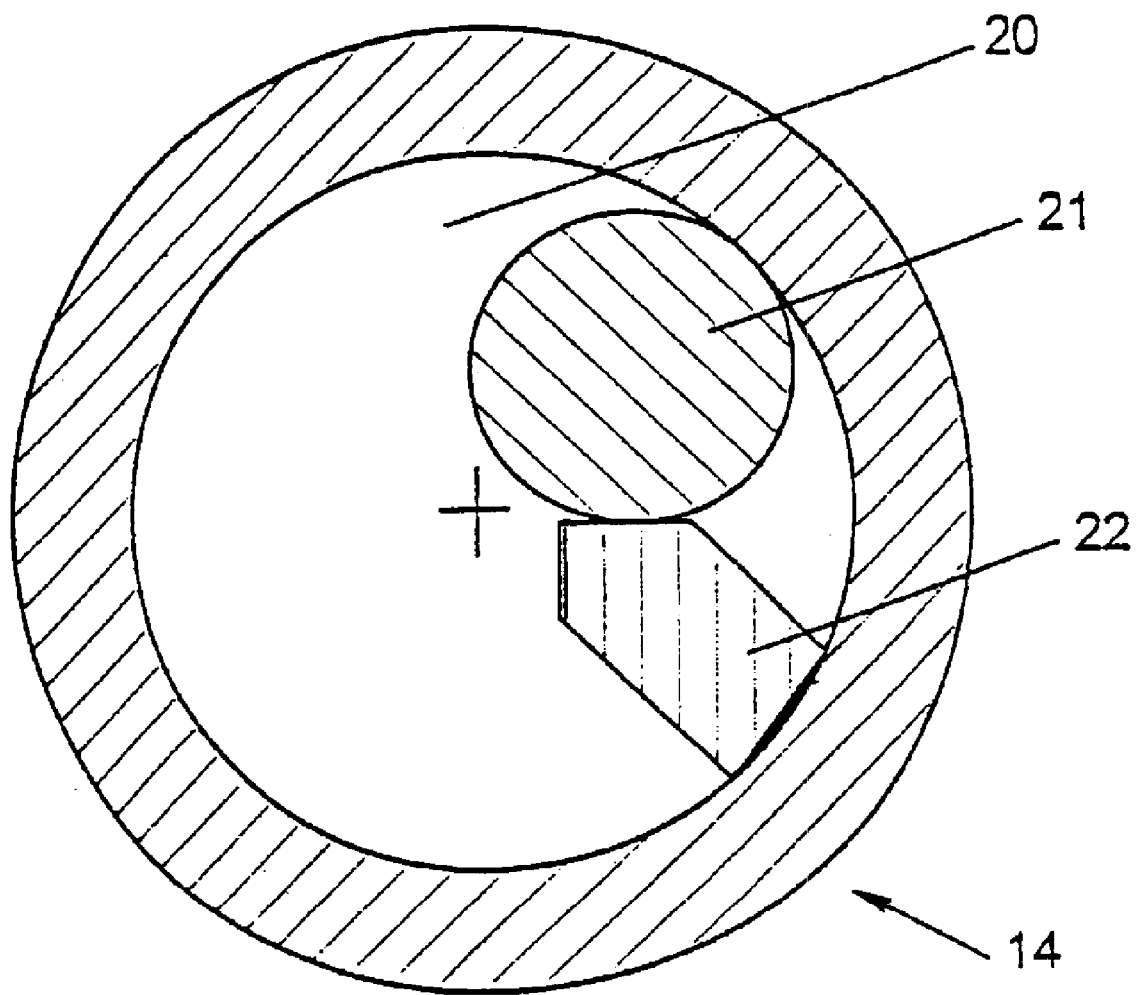
FIG. 2 shows a cross section through a beating roller with a stumble strip.

FIG. 2 shows the cross section of an embodiment of a feed roller 14 with a hollow space 20 and with a metal rod 21 contained in said hollow space 20, said feed roller serving as a pulse generating means. A stumble strip 22 is accommodated on the inner wall of the hollow space 20. The metal rod 21 is not fastened in the hollow space 20. The length of the metal rod 21 is slightly shorter than the axial length of the hollow space 20. It is thus made certain that the metal rod 21 only has little play in axial direction.

Figure 3:
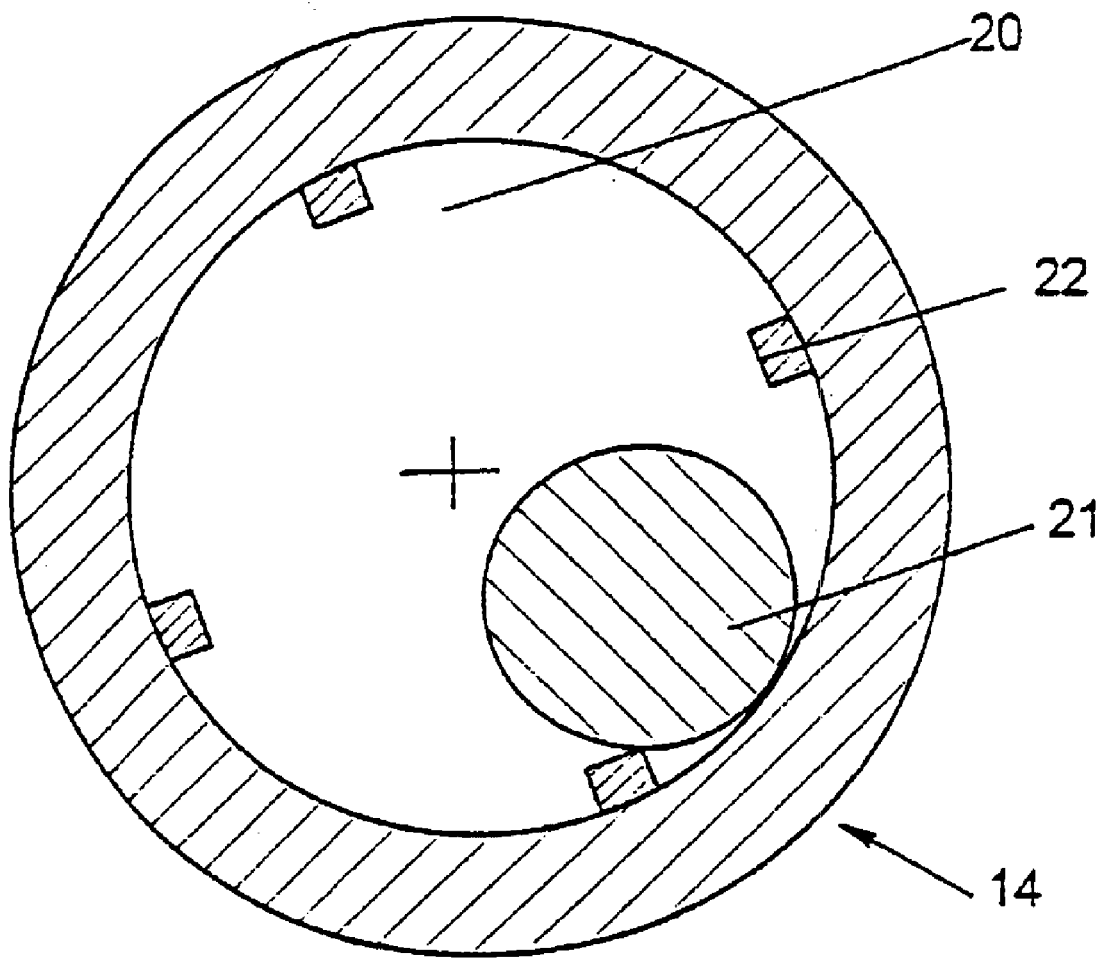
FIG. 3 shows a cross section through a beating roller with four stumble strips.

FIG. 3 shows the cross section of another variant of a feed roller 14 with a hollow space 20 and with a metal rod 21 contained in said hollow space 20. In this case, four stumble strips 22 are accommodated in such a manner that they are offset at an angle of 90° relative to each other. In this case, the metal rod 21 is not fastened in the hollow space 20 either.

Figure 4:
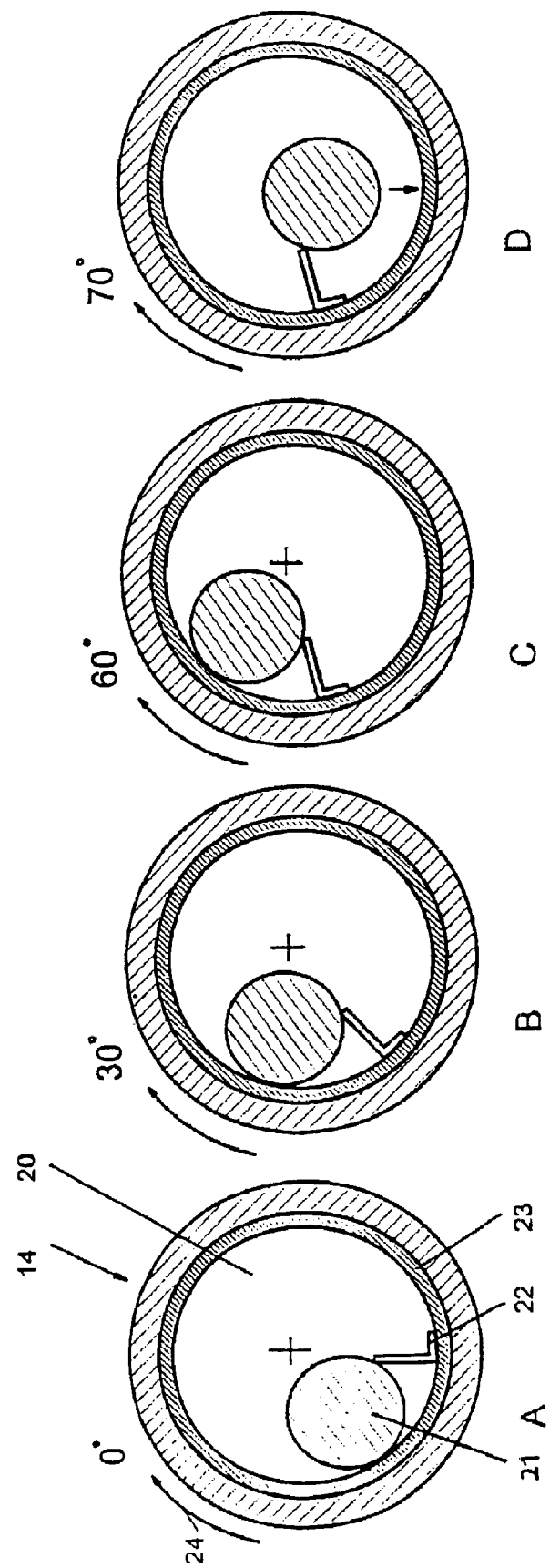
FIG. 4 shows cross sections through a beating roller in various stages of rotation.

FIG. 4 shows the way of operation of the feed roller 13, 14 provided with the hollow space 20 and with a stumble strip 22 in various stages of rotation. In this case the feed roller 14, which otherwise is not made of metal, is fitted on its inner side with a metal cylinder 23 that provides the feed roller 14 with the required stability. The roller 14 rotates in the direction of rotation 24 shown.

In part A of FIG. 4 the roller 14 is shown with the stumble strip 22 being at its lowest point. In this position, the strip 22 has already slightly lifted the rod 21 from its lowermost position. As rotation continues, the strip 22 has been further rotated about 30°, according to part B of FIG. 4, and has taken the rod 21 along by just this section. In part C of FIG. 4 the roller 14 has been further rotated 30°. The strip 22, which has taken the rod 21 along, has also been further rotated 30°. As the roller 14 is rotated further, the rod 21 springs over the strip 22 and falls onto the lowest point of the inner wall. A mechanical pulse is thus transmitted to the roller 14 and to a printed circuit board PCB contacting the roller 14 (FIG. 1). As the roller 14 is rotated further, the rod 21 first rolls down along the inner wall of the hollow space 20 and is only taken along by the strip 22 again as soon as said strip is capable of taking the rod 21 along.

Figure 5:
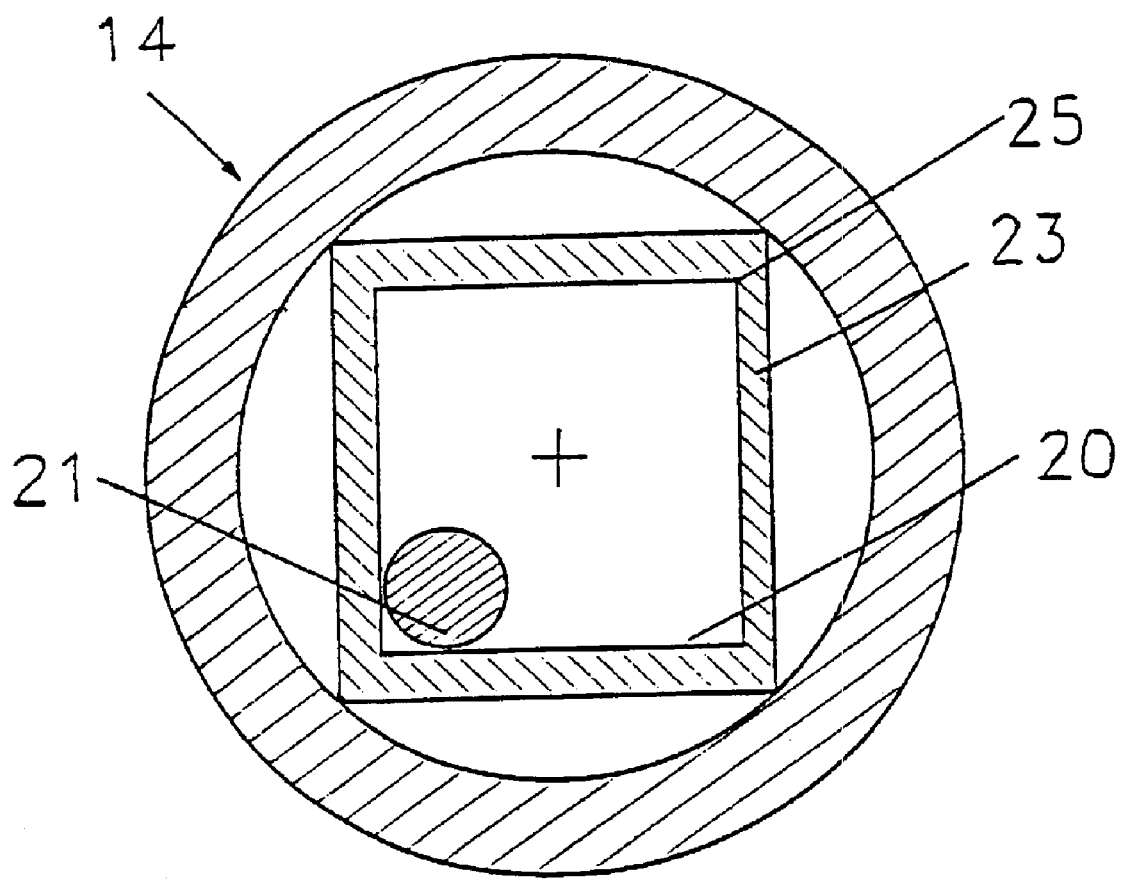
FIG. 5 shows a cross section through a beating roller with a square inner cross section.

FIG. 5 shows another variant of a beating roller 14. In this case, the hollow space 20 in the roller 14 is square in section. For the purpose, a rectangular tube 23 with a square section is embedded within the roller 14. In this case, a metal rod 21 falls from one corner (inner edge) 25 to the other as the roller 14 is rotating so that, in so doing, pulses are exerted onto the roller 14 and from there onto the printed circuit boards PCB.

Figure 6:
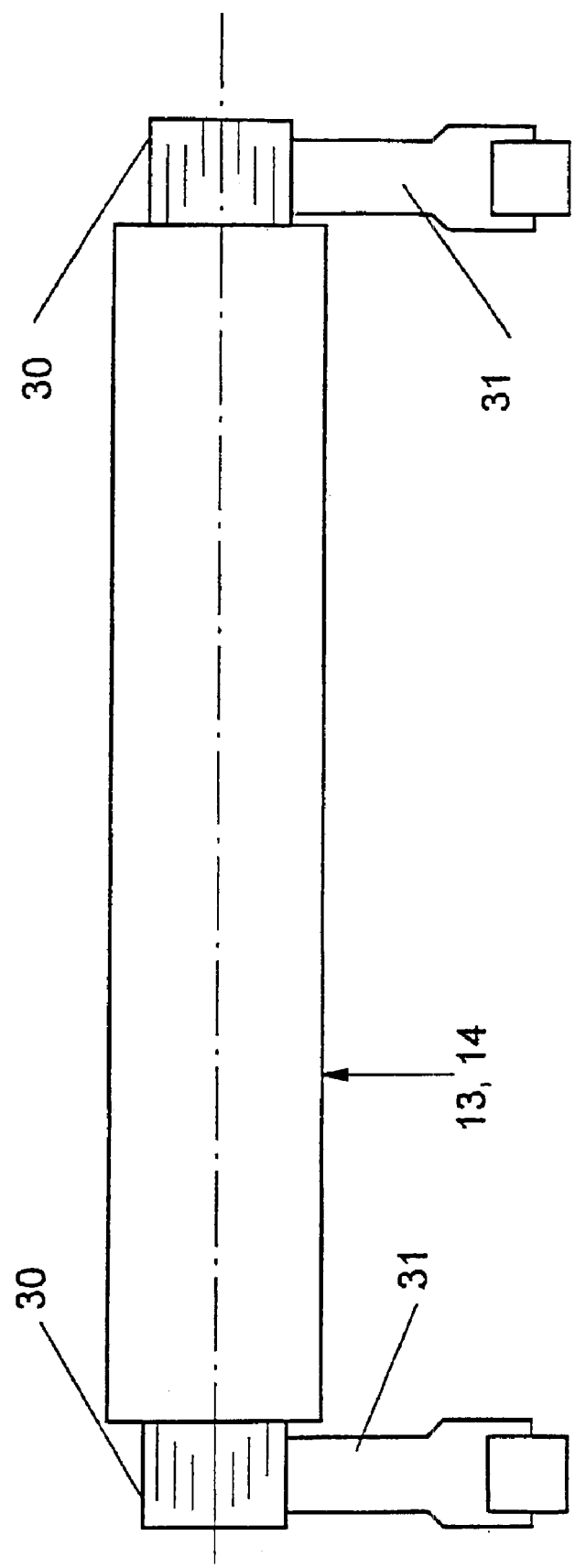
FIG. 6 shows a top view of a pulse generating means designed as a ratchet.

FIG. 6 shows a top view of a feed roller 13, 14 with one ratchet 30 attached to either front sides. The ratchets 30 lie on the same axis as the roller 13, 14 and are rigidly connected to it.

Beaters 31 are abutting the periphery of each of the ratchets 30 under the force of a spring, said beaters being accommodated in bearings in such a way that they may be deviated.

This arrangement is shown in detail from the front in FIG. 7A. In this case, the roller 13, 14 is hidden by the ratchet 30. The ratchet 30 consists of a body 38 and of teeth 36 arranged on the body 38. A beater 31 designed as a lever is accommodated on the bearing 32 in such a way that it may be deviated. The bearing 32 is provided for on a part 34 that is attached to a mounting part 35 in the chamber 1. The beater 31 is pressed against the periphery of the ratchet 30 by means of a spring 33.

The ratchet 30 is rotated by the roller 13, 14 in the direction 24. This causes the beater 31 to be deviated by the teeth 36 against the force of the spring. When skipping a tooth 36, the beater 31 springs into the space 37 between the teeth 36, thus exerting a pulse onto the ratchet 30 and, as a result thereof, onto the roller 13, 14. The pulse that has been transmitted to the roller 13, 14 is transmitted to the printed circuit boards PCB.

FIG. 7B shows an alternative variant of the beater 31. This beater 31 differs in shape from the one shown in FIG. 7A.

Another variant of the beater 31 is illustrated in FIG. 7C. As compared to the one represented in FIG. 7A, this beater 31 is characterized by a modified way of transmitting the force of the spring.

A further variant of the beater 31 is represented in FIG. 7D. This beater 31 is not provided with a lever but is designed as a striking pin which is biassed by a spring 33. The spring is carried on bearings in the mounting part 35 of the chamber 1.

The roller 13, 14, which takes the ratchet 30 along, rotates the ratchet 30 with the body 38, the teeth 36 as well as with the spaces 37 between the teeth 36 in the direction 24. The striking pin 31 is deviated by the teeth 36 against the force of the spring 33 and strikes, upon gliding over the teeth 36, into each space 37, pulses being transmitted in the process onto the ratchet 30 and thus onto the roller 13, 14 from where they are finally transmitted to the printed circuit board PCB.

FIG. 8 illustrates a further embodiment of the invention. The upper roller 14 is designed with a ferromagnetic core, here in the form of a bar magnet 23 in the hollow roller 14. Inside the hollow space 20 there is provided an axis 26 about which the roller 14 is running. A stop 43 is moreover accommodated above the axis 26 outside the body of the roller 14. If the pole piece 45 is suitably designed, the stop 43 may be relinquished. An elastic rest 42 is provided for underneath the axis 27 of the lower roller 13 to serve as a bearing insert in order to reduce the wear of the bearings and to achieve a greater shock amplitude on transmitting the pulses.

In close proximity to the upper roller 14 there is further arranged an electromagnet 40 configured as a pulse generating means that is provided with a coil 41 and electric feed lines 44. By supplying the coil 41 of the electromagnet 40 with a pulsed current, a magnetic field is generated at the pole piece 45 of the electromagnet 40 so that the bar magnet 23 in the upper roller 14 is attracted by the electromagnet 40. This causes the roller 14 to be lifted. When a pulse is over, the upper roller 14 falls back in its initial position and thus exerts a pulse directly onto the printed circuit boards PCB (not shown) conveyed between the rollers 13 and 14.

Figure 9:
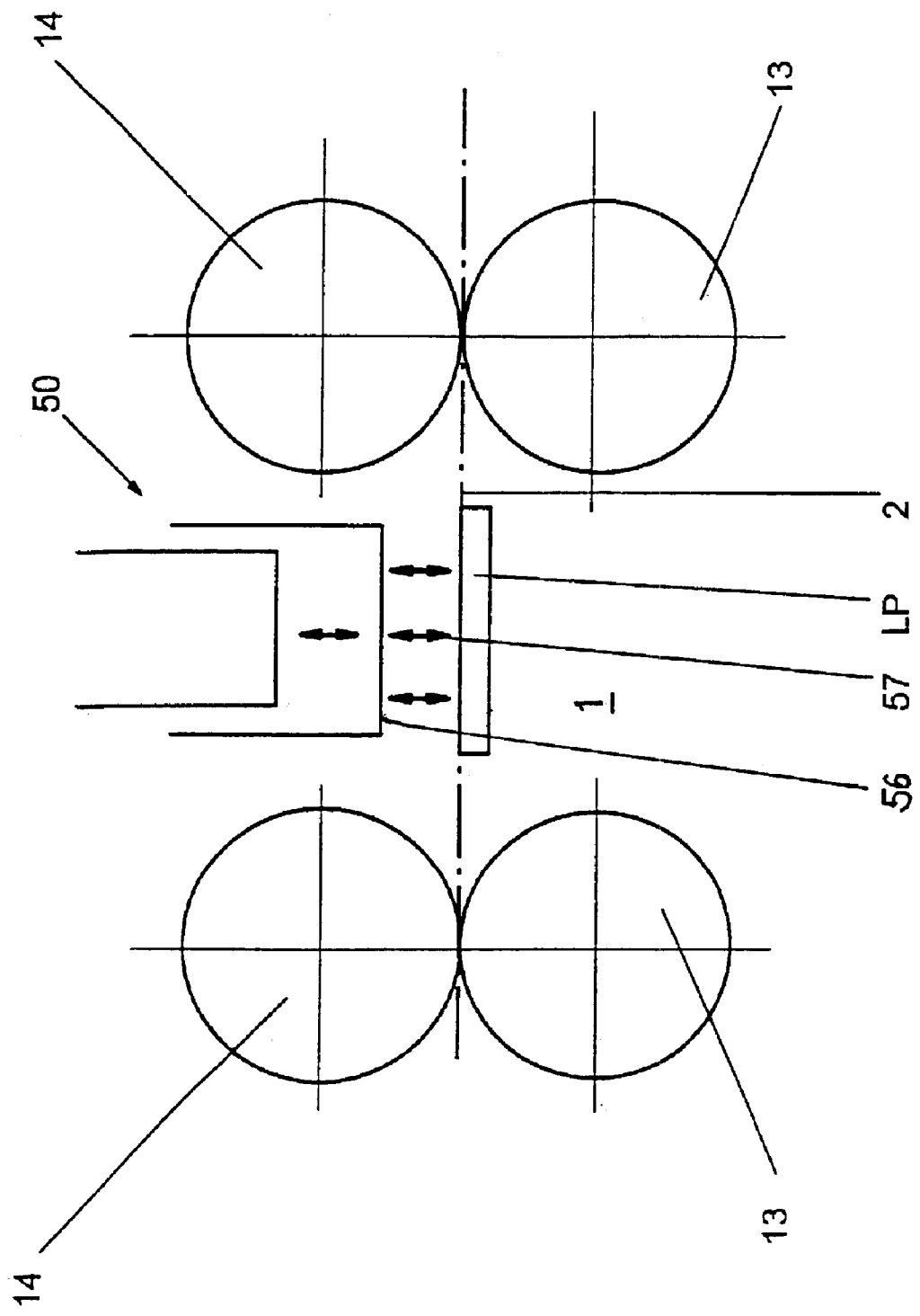
FIG. 9 shows a side view of a pneumatic intermittent beater in the processing plant.

FIG. 9 represents another embodiment of the invention. The printed circuit boards PCB are conveyed within the chamber 1 between the rollers 13 and 14. The chamber 1 is completely filled with the liquid for treatment essentially by means of adequate measures. A pneumatic intermittent beater 50 is accommodated between the upper rollers 14 in close proximity to the conveying plane 2 in which the printed circuit boards PCB are guided. With the help of the pneumatic intermittent beater 50, mechanical pulses 57 are transmitted via the front face of the beater 56 through the liquid for treatment to the printed circuit boards PCB. If the arrangement is adequate, the pulses may also be transmitted from the pneumatic intermittent beater 50 to the printed circuit boards PCB via the rollers 13, 14.

Figure 10:
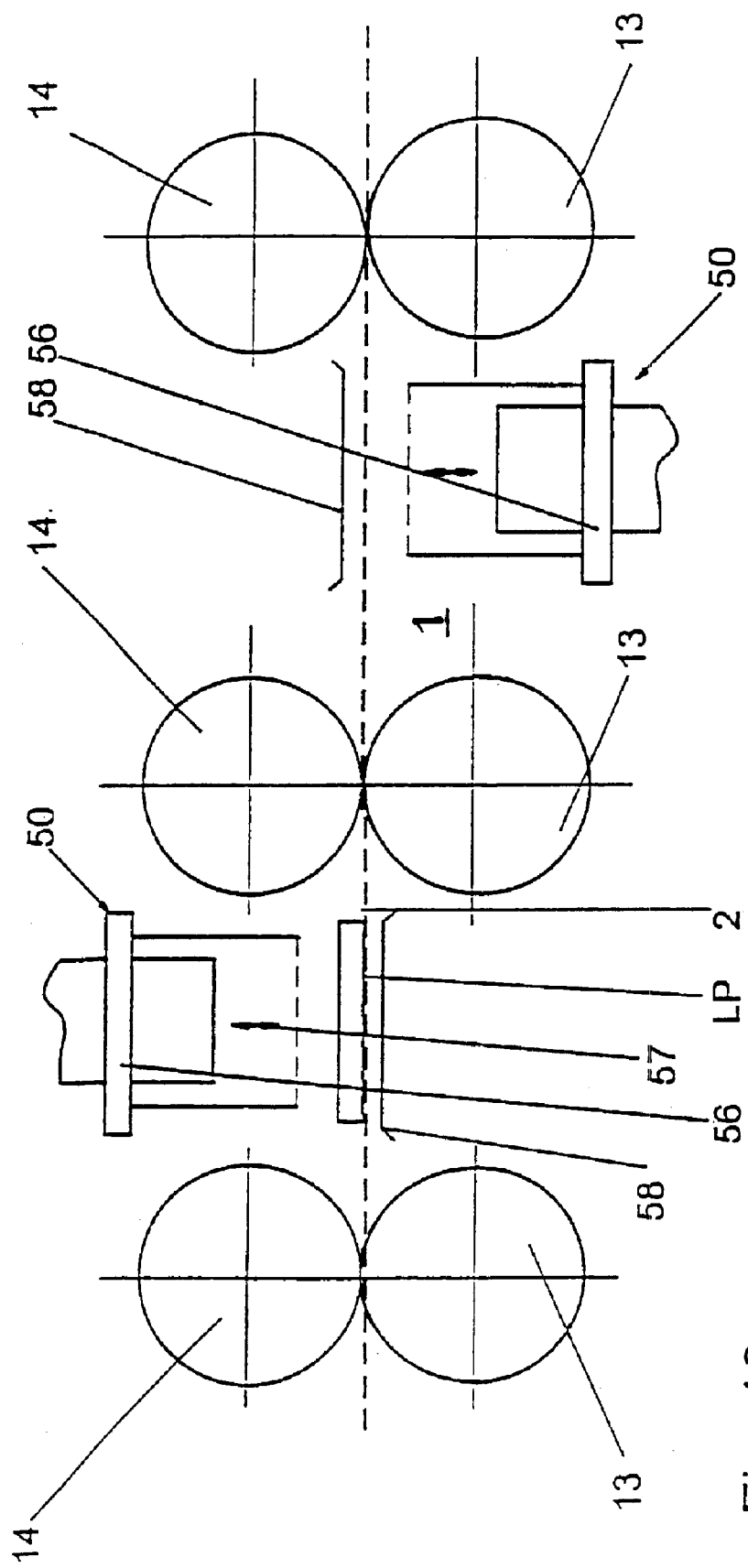
FIG. 10 shows a side view of a partial view of a plant with two pneumatic intermittent beaters.

FIG. 10 shows an array of two pneumatic intermittent beaters 50 in one chamber 1. The pneumatic intermittent beaters 50 are accommodated above or underneath the conveying plane 2 for the printed circuit boards PCB between the rollers 13 or the rollers 14 respectively. Pulsed oscillations 57 are generated in the pneumatic intermittent beaters 50 and are transmitted to the printed circuit boards PCB by way of oscillators 56. In order to reinforce the effect of the pulses in the conveying plane 2, reflecting means 58, such as sheet metal for example, are arranged on that side of the conveying plane 2 that is averse to the pneumatic intermittent beaters 50.

Figure 11:
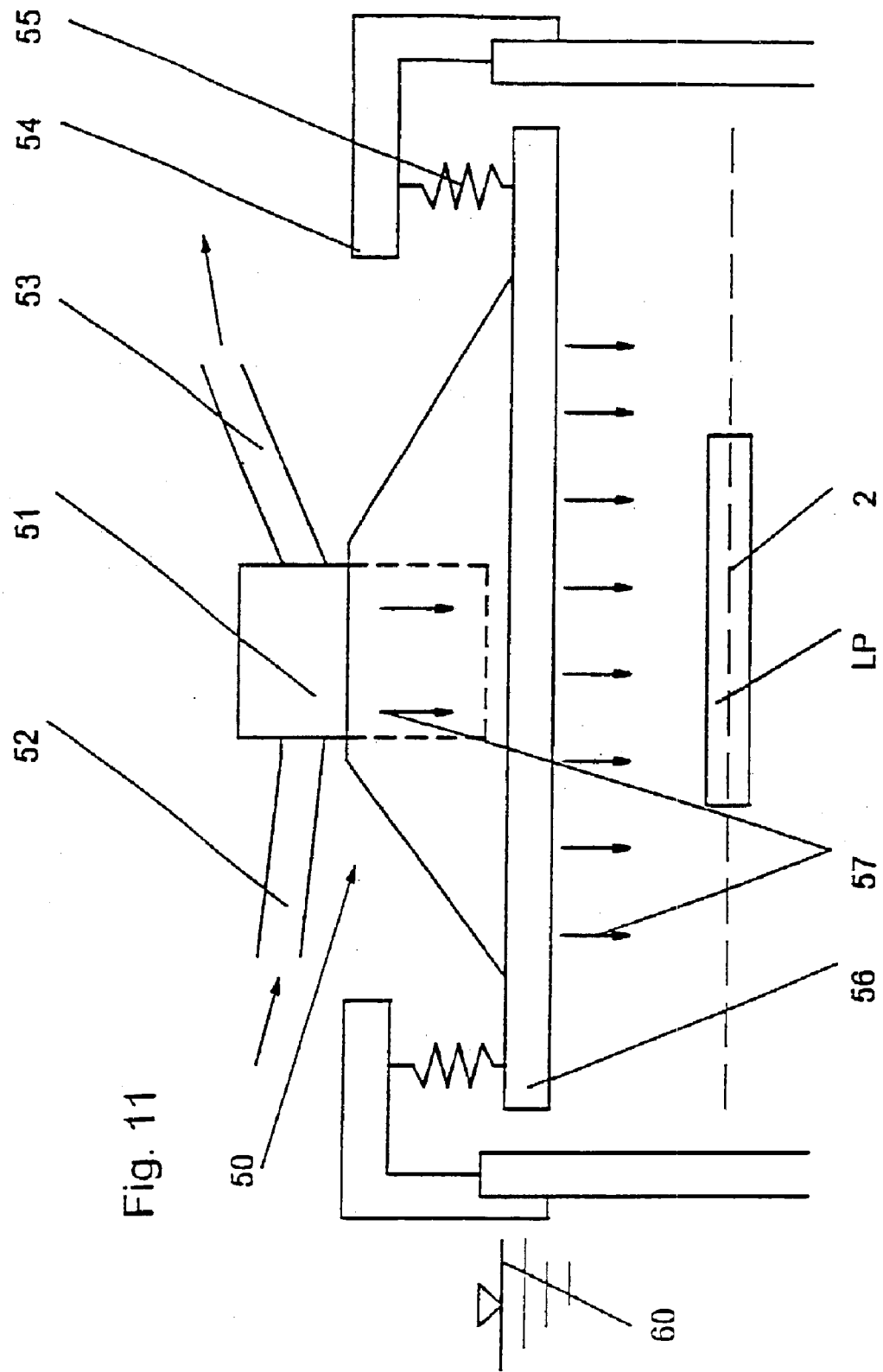
FIG. 11 shows a front view of a pneumatic intermittent beater.

FIG. 11 represents a possible embodiment of a pneumatic intermittent beater 50 that is mounted between two upper rollers 14 that are not illustrated in the figure. FIG. 11 is a section through a plant normal to the direction of transportation. The printed circuit boards PCB are guided in the conveying plane 2. The pneumatic intermittent beater 50 consists of a piston with a controllable valve 51, of a feed pipe for the compressed air 52 and of a drain pipe for the compressed air 53. The piston with the controllable valve 51 is rigidly connected to an oscillator 56 serving as a transmission means. The pneumatic intermittent beater 50 is arranged in close proximity to the conveying plane 2 and is hung on a device 54 by means of springs 55.

The level 60 of the liquid for treatment is situated above the conveying plane 2 and the oscillator 56 so that the printed circuit boards PCB and the oscillator 56 of the pneumatic intermittent beater 50 are completely immersed into the liquid for treatment.

The compressed air, which is admitted by a valve into the piston, causes the preferably heavy piston to accelerate downward in the direction of the arrow 57 and generates mechanical pulses 57 in the oscillator 56 on impinging on said oscillator 56, said pulses being transmitted to the printed circuit boards PCB in the conveying plane 2 through the liquid for treatment.

FIG. 12 represents a further embodiment of the invention: printed circuit boards PCB that are conducted in the conveying plane 2 through the processing chamber 1 pass through fan nozzles 70 between the feed rollers 13 and 14, said nozzles being provided with jet chambers 71 with nozzle apertures 72. Pneumatic intermittent beaters 50 communicate with the jet chambers 71 via oscillators 56 that transmit pulses 57 to the nozzles 70 so that the liquid for treatment that is delivered by the nozzles 70 to the surfaces of the printed circuit boards PCB impinges on them in pulsated jets. The nozzles 70 are arranged in such a manner that the nozzle apertures 72 are located underneath the level 60 of the liquid in the chamber 1. For the rest, the device corresponds to the one illustrated in FIG. 11 so that reference is made to that description. FIG. 13 shows another embodiment of the invention, this embodiment constituting an improvement of the arrangement represented in FIG. 12. Furthermore, in this embodiment, the principle already shown in the FIGS. 7 and 7A–7D for generating pulses is realized. The reader is referred to the description of the FIGS. 7 and 7A–7D with regard to the elements of the device and to the corresponding reference numerals carried forward from said Figs.

In this case, the printed circuit boards PCB are conveyed past a preferably solid metal plate 73 positioned at a distance of only a few millimeters (e.g., 1–3 mm) from the conveying plane 2 and through which the pulses are transferred by way of the liquid for treatment to the printed circuit boards PCB. For this purpose, the metal plate 73 is arranged within the liquid for treatment together with an anvil 75. The metal plate 73 is preferably soldered to the anvil 75. The anvil 75 should at least in parts protrude from the liquid for treatment. The two elements are normally resting and are connected to the processing facility in a manner that has not been illustrated herein. The metal plate 73 extends over the entire width of the conveying path so that pulses may be transmitted onto the printed circuit boards PCB on the entire width of the conveying path.

Pulses are generated by a ratchet-like pulse generating means 30 that may be configured in the same manner as the pulse generating means in the FIGS. 7 and 7A–7D and that functions in the same way. By way of the lever 31 and the hammer 74 connected to said lever 31, impacts are transferred onto the anvil 75 and the metal plate 73 so that pulses may be generated in the printed circuit boards PCB.

LISTING OF REFERENCE NUMBERALS 1 processing chamber
2 conveying plane
3 direction of transportation
4 entrance wall at the chamber 1

5 exit wall at the chamber 1
6 side walls of the chamber 1
7 floor of the chamber 1
8 lid of the chamber 1
9 feed pipe to the nozzles 10
10 nozzles
11 entrance slot
12 exit slot
13 lower transportation mean/feed rollers
13' lower transportation means/feed roller at the entrance slot 11
13" lower transportation means/feed roller at the exit slot 12
14 upper transportation means/feed rollers
14' upper transportation means/feed roller at the entrance slot 11
14" upper transportation means/feed roller at the exit slot 12
20 hollow space in the rollers 13, 14
21 pulse generating means, body, metal rod
22 projection, stumble strip
23 inner lining, ferromagnetic core, steel cylinder, rectangular tube in the rollers 13, 14, bar magnet
24 direction of rotation of the rollers 13, 14
25 inner edge in the rectangular tube 23
26 axis of the upper roller 14
27 axis of the lower roller 13
30 wheel provided with projections 36, ratchet
31 pulse generating means, beater, striking pin
32 bearing for the beater 31
33 spring at the beater 31
34 fastening part for the beater 31
35 mounting part for fastening the beater 31
36 projection, teeth at the beater 31
37 space between the teeth 36
38 body of the wheel, the ratchet 30
40 pulse generating means, electromagnet
41 coil of the electromagnet 40
42 elastic rest for accommodating the lower roller 13
43 stop for the upper roller 14
44 electric feed lines for the electromagnet 40
55 pole piece of the electromagnet 40
50 pulse generating means, pneumatic intermittent beater
51 piston with controllable valve
52 feed line for delivering compressed air to the pneumatic intermittent beater 50
53 drain pipe for carrying the compressed air away from the pneumatic intermittent beater 50
54 suspension device for the pneumatic intermittent beater 50
55 springs on the suspension device 54
56 pulse generating means, oscillator at the pneumatic intermittent beater 50
57 pulses
58 reflecting means
60 level of the liquid for treatment
70 fan nozzles
71 jet chambers of the fan nozzles 70
72 nozzle apertures in the fan nozzles 70
73 metal plate
74 hammer
75 anvil

What is claimed is:

1. A device for treating circuit carriers (PCB) provided with through holes and/or cavities with facilities for contacting the liquid for treatment with the circuit carriers (PCB) as well as transportation means (13, 14) for the circuit carriers (PCB), comprising means for conveying the circuit carriers (PCB) in a horizontal conveying path and in one conveying plane (2), wherein pulse generating means (21, 31, 40, 50) are provided for comprising means for directly exciting circuit carriers (PCB) via any of
   (a) the transportation means (13, 14) and
   (b) the liquid;
for treatment by mechanical pulses,
characterized in that the transportation means (13, 14) are at least partially equipped with one magnetic core (23) each and that at least one electromagnet (40) comprises a pulse generating means to each of the transportation means (13, 14) equipped with the magnetic core (23) whereby current supplied in a pulsed manner to the at least one electromagnet (40), causes a force to be exerted onto the transportation means (13, 14) equipped with the magnetic core in such a way that mechanical pulses are generated in the circuit carriers (PCB) through the transportation means (13, 14).

2. The device according to claim 1, characterized in that an additional force that is oriented toward the circuit carriers (PCB) acts on the transportation means (13, 14) and comprises means for the transportation means (13, 14) to be lifted off the circuit carriers (PCB) by the force exerted by the at least one electromagnet (40) and moved back toward the circuit carriers (PCB) upon switching off the at least one electromagnet (40) by way of the additional force for mechanical pulses to be transmitted to the circuit carriers (PCB).

3. The device according to claim 2, characterized in that the force that acts on the transportation means (13, 14) and is oriented toward the circuit carriers (PCB) is any of
   (a) the force of gravitation;
   (b) the force of a spring; and
   (c) a magnetic force.

4. A device for treating circuit carriers (PCB) provided with through holes and/or cavities with facilities for contacting the liquid for treatment with the circuit carriers (PCB) as well as transportation means (13, 14) for the circuit carriers (PCB), comprising means for conveying the circuit carriers (PCB) in a horizontal conveying path and in one conveying plane (2), wherein pulse generating means (21, 31, 40, 50) are provided for comprising means for directly exciting circuit carriers (PCB) via any of
   (a) the transportation means (13, 14) and
   (b) the liquid;
for treatment by mechanical pulses,
characterized in that the transportation means (13, 14) are at least partially linked to at least one wheel (30) each, said at least one wheel being provided on its periphery with at least one projection (36), and rotatably carried on bearings together with the at least one wheel (30) on one common axis and that one springy or resiliently accommodated beater (31) comprises a pulse generating means abutting the periphery of the at least one wheel (30) in such a manner whereby the beater (31) gliding over the projection (36) to the at least one wheel (30) produces mechanical pulses which are transmitted to the transportation means (13, 14) connected to the at least one wheel (30) and from said transportation means (13, 14) to the circuit carriers (PCB).

5. A device for treating circuit carriers (PCB) provided with through holes and/or cavities with facilities for contacting the liquid for treatment with the circuit carriers (PCB) as well as transportation means (13, 14) for the circuit carriers (PCB), comprising means for conveying the circuit carriers (PCB) in a horizontal conveying path and in one conveying plane (2), wherein pulse 2 generating means (21, 31, 40, 50) are provided for comprising means for directly exciting circuit carriers (PCB) via any of (a) the transportation means (13, 14) and
(b) the liquid;
for treatment by mechanical pulses,
characterized in that the transportation means (13, 14) are configured so as to be rotatable and that the pulse generating means (21, 31, 40, 50) are arranged and designed to comprise means whereby the pulses caused by rotation of the transportation means (13, 14).

6. The device according to any one of claims 5, 4 and 1, characterized in that the pulse generating means (21, 31, 40, 50) comprise means whereby pulses generated have pulse components acting vertically on the surface of the circuit carrier.

7. A method for treating circuit carriers provided with through holes and/or cavities in which
   (a) the circuit carriers (PCB) are conveyed on a horizontal conveying path and in one conveying plane (2) with the help of transportation means (13, 14) and
   (b) with the circuit carriers being brought into contact with a liquid for treatment in the process, and
   (c) wherein mechanical pulses are transmitted directly to the circuit carriers (PCB) via any of
      (i) the transportation means (13, 14) and
      (ii) the liquid for treatment
   by means of pulse generating means (21, 31, 40, 50), characterized in that
   (d) pulse generating means (50) are arranged within the liquid for treatment on the conveying plane (2),
   (e) pulses are transmitted by the pulse generating means (50) to the circuit carriers (PCB) that are conveyed in the conveying plane (2) through the liquid for treatment,
   (f) wherein the pulses are generated in the pulse generating means (50) in an electromechanical and/or in a compressed air driven manner and are transmitted by way of at least one transmission means (56) to the liquid for treatment and from said liquid for treatment to the circuit carriers (PCB).

8. A method for treating circuit carriers provided with through holes and/or cavities in which
   (a) the circuit carriers (PCB) are conveyed on a horizontal conveying path and in one conveying plane (2) with the help of transportation means (13, 14) and
   (b) with the circuit carriers being brought into contact with a liquid for treatment in the process, and
   (c) wherein mechanical pulses are transmitted directly to the circuit carriers (PCB) via any of
      (i) the transportation means (13, 14) and
      (ii) the liquid for treatment
   by means of pulse generating means (21, 31, 40, 50), characterized in that
   (d) the transportation means (13, 14) are at least partially equipped with one magnetic core (23) each and
   (e) that at least one electromagnet (40) is assigned as a pulse generating means to each of the transportation means (13, 14) equipped with the magnetic core (23) in such a manner that, by supplying current in a pulsed manner to the at least one electromagnet (40), a force is exerted onto the transportation means (13, 14) equipped with the magnetic core in such a way that mechanical pulses are generated in the circuit carriers (PCB) through the transportation means (13, 14).

9. The method according to claim 8, characterized in that
   (f) an additional force that is oriented toward the circuit carriers (PCB) acts on the transportation means, so that the transportation means (13, 14) are lifted off the circuit carriers (PCB) by the force that is exerted by the at least one electromagnet (40) and is moved back toward the circuit carriers (PCB) upon switching off the at least one electromagnet (40) by way of the additional force and that mechanical pulses are thus transmitted to the circuit carriers (PCB).

10. The method according to claim 9, characterized in that the force of any of
   (i) gravitation;
   (ii) the force of a spring; and
   (iii) a magnetic force acts on the circuit carriers (PCB).

11. A method for treating circuit carriers provided with through holes and/or cavities in which
   (a) the circuit carriers (PCB) are conveyed on a horizontal conveying path and in one conveying plane (2) with the hem of transportation means (13, 14) and
   (b) with the circuit carriers being brought into contact with a liquid for treatment in the process, and
   (c) wherein mechanical pulses are transmitted directly to the circuit carriers (PCB) via any of
      (i) the transportation means (13, 14) and
      (ii) the liquid for treatment
   by means of pulse generating means (21, 31, 40, 50), characterized in that
   (d) the transportation means (13, 14) are at least partially linked to at least one wheel (30) each and rotatably carried on bearings together with the wheel (30) on one common axis,
   (e) the at least one wheel (30) being provided on its periphery with at least one projection (36),
   (f) that one springy or resiliently accommodated beater (31) serving as a pulse generating means is abutting the periphery of the at least one wheel (30) and glides over the at least one projection (36) on rotation of the at least one wheel (30) and
   (g) wherein mechanical pulses are transmitted by the beater (31) gliding over the projection (36) to the at least one wheel (30) and, as a result thereof, to the transportation means (13, 14) connected to the at least one wheel (30) and from said transportation means (13, 14) to the circuit carriers (PCB).

12. A method for treating circuit carriers provided with through holes and/or cavities in which
   (a) the circuit carriers (PCB) are conveyed on a horizontal conveying path and in one conveying plane (2) with the help of transportation means (13, 14) and
   (b) with the circuit carriers being brought into contact with a liquid for treatment in the process, and
   (c) wherein mechanical pulses are transmitted directly to the circuit carriers (PCB) via any of
      (i) the transportation means (13, 14) and
      (ii) the liquid for treatment
   by means of pulse means (21, 31, 40, 50), characterized in that
   (d) the transportation means utilized are at least partially feed rollers (14) that are each provided with one substantially cylindrical hollow space (20) having a substantially cylindrical inner wall,
   (e) at least one body (21) serving as a pulse generating means rolls down along the inner wall in the hollow space (20) when the feed rollers (14) are rotating,
   (f) thereby springing over a projection (22) extending in axial direction on the inner wall, and (g) so that pulses are transmitted to the feed rollers (14) and from the feed rollers (14) to the circuit carriers (PCB) as the at least one body (21) falls down and impinges on the inner wall of the feed roller.

13. The method according to claim 12, characterized in that the body (21) is substantially cylindrical in shape.

14. A method for treating circuit carriers provided with through holes and/or cavities in which
   (a) the circuit carriers (PCB) are conveyed on a horizontal conveying path and in one conveying plane (2) with the help of transportation means (13, 14) and
   (b) with the circuit carriers being brought into contact with a liquid for treatment in the process, and
   (c) wherein mechanical pulses are transmitted directly to the circuit carriers (PCB) via any of
      (i) the transportation means (13, 14) and
      (ii) the liquid for treatment
   by means of pulse generating means (21, 31, 40, 50), characterized in that rotating transportation means (13, 14) are employed and that the pulses are caused by the rotation of said transportation means (13, 14).

15. The method according to any one of claims 14, 12, 11, 8 and 7, characterized in that such pulses are generated by means of the pulse generating means (21, 31, 30, 50) that have pulse components acting vertically on the surface of the circuit carriers.

16. A device for treating circuit carriers (PCB) provided with trough holes and/or cavities with facilities for contacting the liquid for treatment with the circuit carriers (PCB) as well as transportation means (13, 14) for the circuit carriers (PCB), comprising means for conveying the circuit carriers (PCB) in a horizontal conveying path and in one conveying plane (2), wherein pulse generating means (21, 31, 40, 50) are provided for comprising means for directly exciting circuit carriers (PCB) via any of
   (a) the transportation means (13, 14) and
   (b) the liquid;
for treatment by mechanical pulses,
characterized in that pulse generating means (50) are provided for within the liquid for treatment on the conveying plane (2), for transmitting pulses to the circuit carriers (PCB) that are conveyed in the conveying plane (2) through the liquid for treatment, with the pulse generating means (50) comprising means for generating pulses in any of
   (a) an electromechanical manner, and
   (b) compressed air driven manner
for transmitting pulses by way of at least one transmission means (56) to the liquid for treatment and from said liquid for treatment to the circuit carriers (PCB).

* * * * *

UNITED STATES PATENT AND TRADEMARK OFFICE
CERTIFICATE OF CORRECTION

PATENT NO. : 6,908,515 B2
DATED : June 21, 2005
INVENTOR(S) : Schroder et al.

It is certified that error appears in the above-identified patent and that said Letters Patent is hereby corrected as shown below:

Title page,
Item [54], Title, should read -- TREATMENT OF CIRCUIT CARRIERS WITH PULSE-LIKE EXCITATION --.

Column 2,
Line 65, before "device" insert -- A --.

Column 14,
Line 63, after "REFERENCE" delete "NUMBERALS" insert -- NUMERALS --.

Column 16,
Line 65, after "wherein pulse" delete "2".

Column 17,
Line 7, after "pulses" insert -- are --.

Column 18,
Line 17, delete "hem" insert -- help --.

Column 20,
Line 20, after "(b)" insert -- a --.

Signed and Sealed this

Thirtieth Day of August, 2005

JON W. DUDAS
*Director of the United States Patent and Trademark Office*